(12) United States Patent
Fukuda et al.

(10) Patent No.: US 7,166,335 B2
(45) Date of Patent: Jan. 23, 2007

(54) LAYER FORMATION METHOD, AND SUBSTRATE WITH A LAYER FORMED BY THE METHOD

(75) Inventors: Kazuhiro Fukuda, Hino (JP); Yasuo Morohoshi, Hino (JP); Akira Nishiwaki, Hino (JP); Yoshikazu Kondo, Hino (JP); Yoshiro Toda, Hino (JP); Kiyoshi Oishi, Hino (JP)

(73) Assignee: Konica Corporation, Tokyo (JP)

( * ) Notice: Subject to any disclaimer, the term of this patent is extended or adjusted under 35 U.S.C. 154(b) by 151 days.

(21) Appl. No.: 10/841,115

(22) Filed: May 7, 2004

(65) Prior Publication Data

US 2004/0213920 A1     Oct. 28, 2004

Related U.S. Application Data

(62) Division of application No. 10/378,695, filed on Mar. 4, 2003, now Pat. No. 6,759,100.

(30) Foreign Application Priority Data

Jun. 10, 2002     (JP)     ............................ 2002-168392

(51) Int. Cl.
*C23C 16/50*     (2006.01)

(52) U.S. Cl. ...................... 427/562; 427/569; 427/576; 427/578; 427/255.23

(58) Field of Classification Search ................ 427/562, 427/569, 576, 578, 255.23
See application file for complete search history.

*Primary Examiner*—Timothy Meeks
*Assistant Examiner*—Howard Abramowitz
(74) *Attorney, Agent, or Firm*—Lucas & Mercanti, LLP

(57) ABSTRACT

A layer formation method is disclosed which comprises supplying gas to a discharge space, exciting the supplied gas at atmospheric pressure or at approximately atmospheric pressure by applying a high frequency electric field across the discharge space, and exposing a substrate to the excited gas, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geq IV > V_2$ or $V_1 > IV \geq V_2$, and power density of the second high frequency electric field is not less than 1 W/cm$^2$.

12 Claims, 3 Drawing Sheets

LAYER FORMATION METHOD, AND SUBSTRATE WITH A LAYER FORMED BY THE METHOD

CROSS-REFERENCE TO RELATED CASES

This application is a divisional of U.S. patent application Ser. No. 10/378,695 filed Mar. 4, 2003, now U.S. Pat. No. 6,759,100.

FIELD OF THE INVENTION

The present invention relates to a novel layer formation method employing atmospheric pressure plasma discharge treatment, and a substrate with a layer formed by the method.

BACKGROUND OF THE INVENTION

A method is known in which a layer with high quality is obtained employing a mixed gas of rare gas and a layer formation gas according to an atmospheric pressure plasma discharge treatment method, however, this method results in cost increase, since helium or argon which is employed as the discharge gas, is expensive. When a cheap gas other than rare gas, for example, an oxygen gas, a nitrogen gas or carbon dioxide in air, is used as a discharge gas in this method, stable discharge does not occur under a conventional high frequency electric field and a uniform layer is difficult to be formed, since the strength (hereinafter referred to also as electric field intensity) of electric field starting discharge is high.

A method is disclosed in Japanese Patent O.P.I. Publication No. 10-154598 in which even a gas having a high discharge starting electric field intensity such as a nitrogen gas can induce discharge due to application of a pulse electric field. However, in this method, plasma density is low, a formed layer is poor in quality, and the layer formation speed is low, resulting in low productivity.

A method is disclosed in Japanese Patent O.P.I. Publication No. 11-16696 in which an oxygen gas or a mixed gas of an oxygen gas and inert gas is activated or ionized between preliminary electrodes by application of low frequency voltage, the activated or ionized gas is supplied together with an oxygen gas or a mixed gas of an oxygen gas and inert gas, which is not activated nor ionized, to a space between main electrodes which are provided in parallel with the preliminary electrodes, high frequency voltage is applied across the main electrodes to generate plasma at atmospheric pressure and generate active species, and a substrate is surface treated in which the surface of the substrate is etched with the active species or an organic substance on the surface of the substrate is subjected to ashing with the active species.

A method is disclosed in Japanese Patent O.P.I. Publication No. 2002-110397 in which an argon gas is used as a discharge gas, and an electric field in which a pulsed high frequency electric field and a pulsed direct current electric field are superposed is applied to an electrode on one side, whereby stable discharge can be produced to form a layer on a substrate.

A method for loading an electronic component is disclosed in Japanese Patent O.P.I. Publication No. 11-191576 in which a nitrogen gas is used, and an electric field in which a high frequency electric field and a low frequency electric field are superposed is used, whereby plasma is generated, and a substrate is washed with the generated plasma.

However, it has been found that when the method disclosed in Japanese Patent O.P.I. Publication No. 11-16696 is used for forming a layer, that is, an oxygen gas or a mixed gas of an oxygen gas and inert gas is activated or ionized between preliminary electrodes by application of low frequency electric field, the activated or ionized gas is mixed with another layer formation gas, and the resulting mixture gas is supplied to a space between main electrodes and high frequency voltage is applied across the main electrodes, particles are produced and no layer is not formed. Further, it has been found that the method comprising mixing an oxygen gas in plasma state and a layer formation gas has danger of explosion, which is not suitable for a layer formation method.

A layer formation method is disclosed in Japanese Patent O.P.I. Publication No. 2002-110397 in which after plasma is generated by application of direct pulsed electric field and the generated plasma is stabilized by application of a high frequency electric field replacing the direct pulsed electric field, a substrate is introduced into the stabilized plasma, wherein the direct pulsed electric field and the high frequency electric field are not superposed. It has been found that the electric field application described above cannot provide a layer with high performance.

Japanese Patent O.P.I. Publication No. 11-191576 only discloses a method for washing an electronic component, in which the high frequency electric field and the low frequency electric field are superposed. It has been found that a simple superposing of the high frequency electric field and the low frequency electric field is difficult to form a layer with high performance.

SUMMARY OF THE INVENTION

The present invention has been made in view of the above. An object of the invention is to provide a layer formation method which can generate high density plasma even employing a cheap and safe discharge gas such as a nitrogen gas to form a layer with high quality at high speed, and can provide a substrate having a layer with high quality and high performance at low cost employing the method.

DETAILED DESCRIPTION OF THE INVENTION

Figure 1:
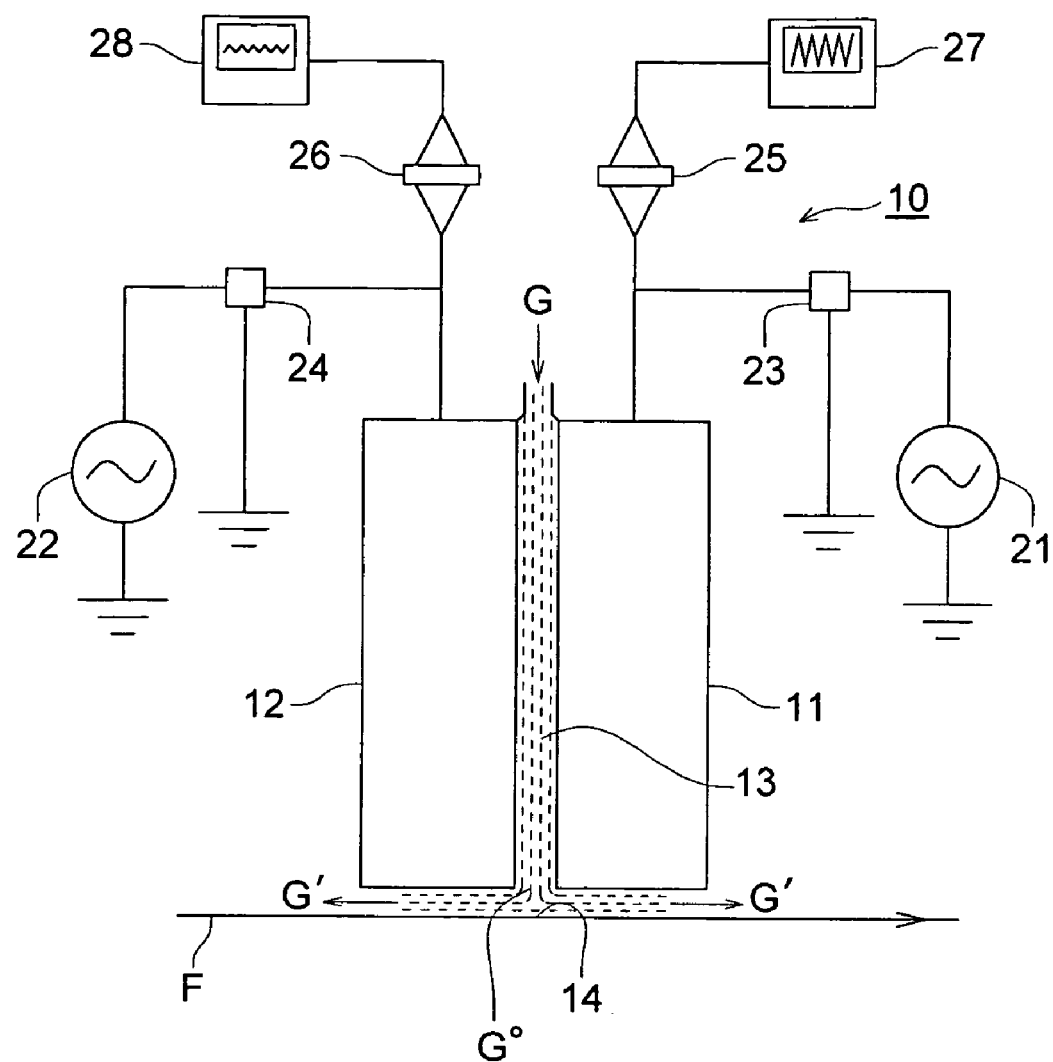
FIG. 1 shows a schematic drawing of one embodiment of the atmospheric pressure plasma discharge treatment apparatus of the invention employing a jet process.

The present inventors have made an extensive study in order to attain the above object, and as a result, they have found that even a discharge gas with high strength of discharge starting electric field such as a nitrogen gas can generate high density plasma due to application of a specific high frequency across two electrodes opposed to each other to form a layer with high quality at high speed and at low cost, whereby safe production is secured and environmental load is also reduced.

The invention can be attained by each of the following constitutions:

1-1. A layer formation method comprising the steps of supplying gas containing a layer formation gas to a discharge space, exciting the supplied gas at atmospheric pressure or at approximately atmospheric pressure by applying a high frequency electric field across the discharge space, and exposing a substrate to the excited gas, whereby a layer is formed on the substrate, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geqq IV > V_2$ or $V_1 > IV \geqq V_2$, and power density of the second high frequency electric field is not less than 1 W/cm$^2$.

1-2. The layer formation method of item 1-1 above, wherein the discharge space is provided between a first electrode and a second electrode opposed to each other.

1-3. The layer formation method of item 1-1 above, wherein the power density of the second high frequency electric field is not more than 50 W/cm$^2$.

1-4. The layer formation method of item 1-1 above, wherein the power density of the second high frequency electric field is not more than 20 W/cm$^2$.

1-5. The layer formation method of item 1-1 above, wherein the power density of the first high frequency electric field is not less than 1 W/cm$^2$.

1-6. The layer formation method of item 1-5 above, wherein the power density of the first high frequency electric field is not more than 50 W/cm$^2$.

1-7. The layer formation method of item 1-1 above, wherein the waveform of the first high frequency electric field and the second high frequency electric field is a sine waveform.

1-8. The layer formation method of item 1-2 above, wherein the first high frequency electric field is applied to the first electrode, and the second high frequency electric field is applied to the second electrode.

1-9. The layer formation method of item 1-1 above, wherein the gas, which is supplied to the discharge space, contains a discharge gas in an amount of 90 to 99.9% by volume.

1-10. The layer formation method of item 1-9 above, wherein the discharge gas contains a nitrogen gas in an amount of 50 to 100% by volume.

1-11. The layer formation method of item 1-9 above, wherein the discharge gas contains rare gas in an amount of less than 50% by volume.

1-12. The layer formation method of item 1 above, wherein the layer formation gas contains at least one selected from the group consisting of an organometallic compound gas, a metal halide gas and a metal hydride gas.

1-13. The layer formation method of item 1-12 above, wherein the organometallic compound gas is at least one compound selected from the group consisting of an organosilicon compound, an organotitanium compound, an organotin compound, an organozinc compound, an organoindium compound, and an organoaluminum compound.

1-14. A substrate having a layer, the substrate being prepared by a method comprising the steps of supplying gas containing a layer formation gas to a discharge space, exciting the supplied gas at atmospheric pressure or at approximately atmospheric pressure by applying a high frequency electric field across the discharge space, and exposing a substrate to the excited gas, whereby the layer is formed on the substrate, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geqq IV > V_2$ or $V_1 > IV \geqq V_2$, and power density of the second high frequency electric field is not less than 1 W/cm$^2$.

1-15. A layer formation method comprising the steps of supplying gas containing a layer formation gas and a discharge gas having a nitrogen gas to a discharge space, exciting the supplied gas at atmospheric pressure or at approximately atmospheric pressure by applying a high frequency electric field across the discharge space, and exposing a substrate to the excited gas, whereby a layer is formed on the substrate, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geqq IV > V_2$ or $V_1 > IV \geqq V_2$, and power density of the second high frequency electric field is not less than 1 W/cm$^2$.

1-16. The layer formation method of item 1-15 above, wherein the discharge space is formed between a first electrode and a second electrode opposed to each other.

1-17. The layer formation method of item 1-15 above, wherein the power density of the second high frequency electric field is not more than 50 W/cm$^2$.

1-18. The layer formation method of item 1-15 above, wherein the power density of the second high frequency electric field is not more than 20 W/cm$^2$.

1-19. The layer formation method of item 1-15 above, wherein the power density of the first high frequency electric field is not less than 1 W/cm$^2$.

1-20. The layer formation method of item 1-15 above, wherein the power density of the first high frequency electric field is not more than 50 W/cm$^2$.

1-21. The layer formation method of item 1-15 above, wherein the waveform of the first high frequency electric field and the second high frequency electric field is a sine waveform.

1-22. The layer formation method of item 1-16 above, wherein the first high frequency electric field is applied to the first electrode, and the second high frequency electric field is applied to the second electrode.

1-23. The layer formation method of item 1-15 above, wherein the gas, which is supplied to the discharge space, contains the discharge gas in an amount of 90 to 99.9% by volume.

1-24. The layer formation method of item 1-23 above, wherein the discharge gas contains a nitrogen gas in an amount of 50 to 100% by volume.

1-25. The layer formation method of item 1-23 above, wherein the discharge gas contains rare gas in an amount of less than 50% by volume.

1-26. The layer formation method of item 1-15 above, wherein the layer formation gas contains at least one selected from the group consisting of an organometallic compound gas, a metal halide gas and a metal hydride gas.

1-27. The layer formation method of item 26 above, wherein the organometallic compound gas is at least one compound selected from the group consisting of an organosilicon compound, an organotitanium compound, an organotin compound, an organozinc compound, an organoindium compound, and an organoaluminum compound.

1-28. The layer formation method of item 1-15 above, wherein the frequency $\omega_1$ is not more than 200 kHz.

1-29. The layer formation method of item 1-15 above, wherein the frequency $\omega_2$ is not less than 800 kHz.

1-30. A substrate having a layer, the substrate being prepared by a method comprising the steps of supplying gas containing a layer formation gas and a discharge gas having a nitrogen gas to a discharge space, exciting the supplied gas at atmospheric pressure or at approximately atmospheric pressure by applying a high frequency electric field across the discharge space, and exposing a substrate to the excited gas, whereby the layer is formed on the substrate, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geq IV > V_2$ or $V_1 > IV \geq V_2$, and power density of the second high frequency electric field is not less than 1 W/cm².

1-31. A layer formation method comprising the steps of supplying gas containing a layer formation gas to a discharge space, exciting the supplied gas at atmospheric pressure or at approximately atmospheric pressure by applying a high frequency electric field across the discharge space, and exposing a substrate to the excited gas, whereby a layer is formed on the substrate, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geq IV > V_2$ or $V_1 > IV \geq V_2$, and power density of the first and second high frequency electric fields is not less than 1 W/cm².

1-32. The layer formation method of item 1-31 above, wherein the discharge space is formed between a first electrode and a second electrode opposed to each other.

1-33. The layer formation method of item 1-31 above, wherein the power density of the second high frequency electric field is not more than 50 W/cm².

1-34. The layer formation method of item 1-33 above, wherein the power density of the second high frequency electric field is not more than 20 W/cm².

1-35. The layer formation method of item 1-31 above, wherein the power density of the first high frequency electric field is not less than 1 W/cm².

1-36. The layer formation method of item 1-35 above, wherein the power density of the first high frequency electric field is not more than 50 W/cm².

1-37. The layer formation method of item 1-31 above, wherein the waveform of the first high frequency electric field and the second high frequency electric field is a sine waveform.

1-38. The layer formation method of item 1-32 above, wherein the first high frequency electric field is applied to the first electrode, and the second high frequency electric field is applied to the second electrode.

1-39. The layer formation method of item 1-31 above, wherein the gas, which is supplied to the discharge space, contains the discharge gas in an amount of 90 to 99.9% by volume.

1-40. The layer formation method of item 1-39 above, wherein the discharge gas contains a nitrogen gas in an amount of 50 to 100% by volume.

1-41. The layer formation method of item 1-39 above, wherein the discharge gas contains rare gas in an amount of less than 50% by volume.

1-42. The layer formation method of item 1-31 above, wherein the layer formation gas contains at least one selected from the group consisting of an organometallic compound gas, a metal halide gas and a metal hydride gas.

1-43. The layer formation method of item 1-42 above, wherein the organometallic compound gas is at least one compound selected from the group consisting of an organosilicon compound, an organotitanium compound, an organotin compound, an organozinc compound, an organoindium compound, and an organoaluminum compound.

1-44. The layer formation method of item 1-31 above, wherein current $I_2$ of the second high frequency electric field is higher than current $I_1$ of the first high frequency electric field.

1-45. The layer formation method of item 1-44 above, wherein a ratio of frequency $\omega_2$ to frequency $\omega_1$, $\omega_2/\omega_1$, is not less than 100.

1-46. A substrate having a layer, the substrate being prepared by a method comprising the steps of supplying gas containing a layer formation gas to a discharge space, exciting the supplied gas at atmospheric pressure or at approximately atmospheric pressure by applying a high frequency electric field across the discharge space, and exposing a substrate to the excited gas, whereby the layer is formed on the substrate, wherein the high frequency electric field is an electric field in which a first high frequency electric field and a second high frequency electric field are superposed, frequency $\omega_2$ of the second high frequency electric field is higher than frequency $\omega_1$ of the first high frequency electric field, strength $V_1$ of the first high frequency electric field, strength $V_2$ of the second high frequency electric field and strength IV of discharge starting electric field satisfy relationship $V_1 \geq IV > V_2$ or $V_1 > IV \geq V_2$, and power density of the first and second high frequency electric fields is not less than 1 W/cm².

2-1. A layer formation method comprising the steps of supplying gas to a discharge space formed between a first electrode and a second electrode opposed to each other, applying a high frequency electric field across the discharge space, exciting the gas at atmospheric pressure or at approximately atmospheric pressure, and exposing a substrate to the excited gas, whereby a layer is formed, wherein the high frequency electric field comprises electric field in which a first electric field with first frequency $\omega_1$ and a second electric field with second frequency $\omega_2$ higher than the first frequency $\omega_1$ are superposed.

2-2. The layer formation method of item 2-1 above, wherein the waveform of the first electric field with first frequency $\omega_1$ and the second electric field with second frequency $\omega_2$ is a sine wave.

2-3. The layer formation method of item 2-1 or 2-2 above, wherein the first frequency $\omega_1$ is not more than 200 kHz.

2-4. The layer formation method of any one of items 2-1 through 2-3 above, wherein the second frequency $\omega_2$ is not less than 800 kHz.

2-5. The layer formation method of any one of items 2-1 through 2-4 above, wherein the high frequency electric field comprises a first electric field with first strength $V_1$ and a second electric field with second strength $V_2$ are superposed.

2-6. The layer formation method of item 2-5 above, wherein the first strength $V_1$, the second strength $V_2$, and discharge starting electric field strength IV satisfy the following relationship:

$$V_1 \geq IV > V_2 \text{ or } V_1 > IV \geq V_2$$

2-7. The layer formation method of any one of items 2-1 through 2-6 above, wherein the first high frequency electric field is applied to the first electrode, and the second high frequency electric field is applied to the second electrode.

2-8. A layer formation method comprising the steps of supplying a discharge gas and a layer formation gas to a discharge space formed between a first electrode and a second electrode opposed to each other, applying a high frequency electric field across the discharge space, exciting the discharge gas at atmospheric pressure or at approximately atmospheric pressure to induce discharge and excite the layer formation gas, and exposing the substrate to the excited layer formation gas, wherein the high frequency electric field comprises a first electric field with first strength $V_1$ and a second electric field with second strength $V_2$ being superposed, and the first strength $V_1$, the second strength $V_2$, and discharge starting strength IV satisfy the following relationship:

$$V_1 \geq IV > V_2 \text{ or } V_1 > IV \geq V_2$$

2-9. The layer formation method of item 2-8 above, wherein the first high frequency electric field has first frequency $\omega_1$, and the second high frequency electric field has second frequency $\omega_2$ higher than the first frequency $\omega_1$.

2-10. The layer formation method of item 2-9 above, wherein the first frequency $\omega_1$ is not more than 200 kHz.

2-11. The layer formation method of item 2-9 or 2-10 above, wherein the second frequency $\omega_2$ is not less than 800 kHz.

2-12. The layer formation method of any one of items 2-8 through 2-11 above, wherein the waveform of the first electric field with high frequency and the second electric field with high frequency is a sine wave.

2-13. The layer formation method of any one of items 2-1 through 2-12 above, wherein the gas, which is supplied to the discharge space between the first and second electrodes, contains 90 to 99.9% by volume of discharge gas.

2-14. The layer formation method of any one of items 2-1 through 2-13 above, wherein the discharge gas contains 50 to 100% by volume of a nitrogen gas.

2-15. The layer formation method of any one of items 2-1 through 2-14 above, wherein the discharge gas contains less than 50% by volume of rare gas.

2-16. The layer formation method of any one of items 2-1 through 2-15 above, wherein the layer formation gas contains at least one addition gas selected from the group consisting of gas of an organometallic compound, gas of a metal halide gas and gas of a metal hydride compound gas.

2-17. The layer formation method of item 2-16 above, wherein the organometallic compound contains at least one compound selected from the group consisting of an organic silicon compound, an organic titanium compound, an organic tin compound, an organic zinc compound, an organic indium compound, and an organic aluminum compound.

2-18. A substrate on which a layer is formed according to the layer formation method of any one of items 2-1 through 2-17 above.

2-19. An atmospheric pressure plasma discharge treatment apparatus comprising a first electrode and a second electrode opposed to each other, a first power supply for applying a first high frequency electric field to the first electrode, a second power supply for applying a second high frequency electric field to the second electrode, and a gas supply means for supplying gas to a discharge space between the opposed first and second electrodes.

2-20. The atmospheric pressure plasma discharge treatment apparatus of item 2-19 above, wherein a first filter is provided between the first electrode and the first power supply, and a second filter is provided between the second electrode or the second power supply, and wherein the first filter has a function that current of the frequency from the first power supply to the first electrode is easy to flow, and current of the frequency from the second power supply to the second electrode is difficult to flow, and the second filter has a function that current of the frequency from the second power supply to the second electrode is easy to flow and current of the frequency from the first power supply to the first electrode is difficult to flow.

2-21. The atmospheric pressure plasma discharge treatment apparatus of item 2-19 or 2-20 above, wherein the apparatus comprises an electrode temperature control means for controlling temperature of the first or second electrode.

2-22. The atmospheric pressure plasma discharge treatment apparatus of any one of items 2-19 through 2-21 above, wherein the first power supply has a function capable of applying a voltage higher than the second power supply.

2-23. The atmospheric pressure plasma discharge treatment apparatus of any one of items 2-19 through 2-22 above, wherein the second power supply has a function capable of applying a frequency higher than the first power supply.

2-24. The atmospheric pressure plasma discharge treatment apparatus of any one of items 2-19 through 2-23 above, wherein at least one of the first and second electrodes is a dielectric coated electrode in which a dielectric layer is coated on a conductive metal base material, and the dielectric layer has a void volume of not more than 10% by volume.

2-25. The atmospheric pressure plasma discharge treatment apparatus of item 2-24 above, wherein the dielectric layer has a void volume of not more than 8% by volume.

2-26. The atmospheric pressure plasma discharge treatment apparatus of item 2-24 or 2-25 above, wherein the dielectric coated electrode has a heat resistant temperature of not less than 100° C.

2-27. The atmospheric pressure plasma discharge treatment apparatus of any one of items 2-24 through 2-26 above, wherein the difference in a linear thermal expansion coefficient between the conductive base material and the dielectric in the dielectric coated electrode is not more than $10 \times 10^{-6}/°$ C.

2-28. The atmospheric pressure plasma discharge treatment apparatus of any one of items 2-24 through 2-27 above, wherein the dielectric layer has a thickness of from 0.5 to 3 mm.

2-29. The atmospheric pressure plasma discharge treatment apparatus of any one of items 2-24 through 2-28 above, wherein the dielectric has a dielectric constant of from 6 to 45.

2-30. The atmospheric pressure plasma discharge treatment apparatus of any one of items 2-24 through 2-29 above, wherein the dielectric layer is one formed by thermally spraying ceramic to form a ceramic layer and sealing the ceramic layer with an inorganic compound.

2-31. The atmospheric pressure plasma discharge treatment apparatus of item 2-30 above, wherein the ceramic contains alumina as a main component.

2-32. The atmospheric pressure plasma discharge treatment apparatus of any one of items 2-24 through 2-31 above, wherein the surface of the dielectric layer is surface finished by polishing treatment.

2-33. The atmospheric pressure plasma discharge treatment apparatus of item 2-32 above, wherein the surface of the dielectric layer has a surface roughness Rmax of not more than 10 μm.

The present invention will be detailed below.

In the invention, the discharge plasma treatment is carried out at atmospheric pressure or at approximately atmospheric pressure. Atmospheric pressure or approximately atmospheric pressure herein referred to implies a pressure of 20 kPa to 110 kPa. In order to obtain the effects as described in the invention, the above pressure is preferably 93 kPa to 104 kPa.

In the layer formation method of the invention, gas, which is supplied to a gap (discharge space) between the opposed electrodes, contains gas excited by application of electric field and a layer formation gas, which accepts energy of the excited gas to be in a plasma or excited state and forms a layer.

However, the above method employs as a discharge rare gas such as helium or argon, in which production cost for forming a layer depends on price of the discharge gas. In view of the above and also environmental concern, the present inventors have made study on alternative discharge gas for rare gas. They have studied on air, oxygen, nitrogen, carbon dioxide or hydrogen as an alternative discharge gas, on conditions under which even these gases can produce a high density plasma, and on conditions or a method which provide excellent layer formation property to form a uniform layer with high density. As a result, they have completed the present invention.

Discharge condition in the invention is such that a high frequency electric field applied across a discharge space is an electric field in which a first high frequency electric field and a second high frequency electric field are superposed, frequency $\omega_2$ of the second electric field is higher than frequency $\omega_1$ of the first electric field, strength $V_1$ of the first high frequency electric field, strength $V_2$ of the second high frequency electric field and strength IV of discharge starting electric field satisfy relationship $V_1 \geq IV > V_2$ or $V_1 > IV \geq V_2$, and power density of the second high frequency electric field is not less than 1 W/cm².

The high frequency herein referred to implies a frequency of at least 0.5 kHz. In the superposed high frequency electric field, frequency $\omega_1$ of the first high frequency electric field is superposed on frequency $\omega_2$ of the second high frequency electric field higher than the frequency $\omega_1$, and when both high electric fields have a sine waveform, the resulting waveform is a jagged waveform in which a sine wave of frequency $\omega_1$ is superposed on a sine wave of frequency $\omega_2$ higher than frequency $\omega_1$.

In the invention, strength of discharge starting electric field (hereinafter referred to also as discharge starting electric field intensity) refers to a lowest electric field necessary to induce discharge at a discharge space condition (constitution of electrodes, etc.) or reaction condition (condition of gases, etc.) used in the layer formation method. The discharge starting electric field intensity slightly varies due to kinds of gases supplied to the discharge space, kinds of dielectrics of electrodes or a space distance between opposed electrodes, but it depends mainly on discharge starting electric field intensity of discharge gas in the same discharge space environment.

Such application of the high frequency electric field as described above across a discharge space is considered to be able to induce discharge capable of forming a layer to generate plasma with high density necessary to form a layer with high quality. It is important here that such a high frequency electric field is applied to each of the opposed electrodes, i.e., the electric field is applied to the same discharge space. The high frequency electric field application method disclosed in the Japanese Patent O.P.I. Publication No. 11-16696 described above cannot form the layer that the invention provides, in which a first discharge space between two electrodes opposed to each other and a second discharge space between another two electrodes opposed to each other are separately formed, and a high frequency electric field with different frequencies is applied to each of the first and second spaces.

In the above, superposing of the two continuous waves such as sine waves is described, but the invention is not limited thereto. Two waves may be pulse waves, or one of the two waves may be a continuous wave and the other a pulse wave. The wave may further contain a third electric field component.

A method for applying high frequency electric field across a discharge space between the opposed electrodes is a method employing an atmospheric pressure plasma discharge treatment apparatus in which a first electrode of the opposed electrodes is connected to a first power supply applying a first high frequency electric field with electric field strength $V_1$ and frequency $\omega_1$, and a second electrode of the opposed electrodes is connected to a second power supply applying a second high frequency electric field with electric field strength $V_2$ and frequency $\omega_2$.

The atmospheric pressure plasma discharge treatment apparatus comprises a gas supply means for supplying the discharge gas and layer formation gas to the discharge space between the opposed electrodes. The apparatus preferably comprises an electrode temperature control means for controlling the electrode temperature.

It is preferred that a first filter is connected to the first electrode or the first power supply or is provided between them, and a second filter is connected to the second electrode or the second power supply or is provided between them. The first filter has a function that current of a first high frequency electric field is easy to flow from the first power supply to the first electrode, and current of the second high frequency electric field being grounded, current of a second high frequency electric field is difficult to flow from the second power supply to the first power supply. The second filter has a function that current of a second high frequency electric field is easy to flow from the second power supply to the second electrode, and current of the first high frequency electric field being grounded, current of the first high frequency electric field is difficult to flow from the first power supply to the second power supply. Herein, "current is difficult to flow" means that current of up to 20%, and preferably up to 10% of the current supplied flows, and "current is easy to flow" means that current of not less than 80%, and preferably not less than 90% of the current supplied flows.

In the atmospheric pressure plasma discharge treatment apparatus, it is preferred that the first power supply has a function capable of applying a high frequency electric field higher than the second power supply.

The high frequency electric field intensity (application electric field intensity) or the discharge starting electric field intensity referred to in the invention is measured according to the following method. Measuring method of high frequency electric field intensity $V_1$ or $V_2$ (kV/mm)

High frequency voltage probe (P6015A) is connected to each electrode and oscilloscope TDS 3012B (produced by Techtronix Co., Ltd.), and electric field intensity is measured.

Measuring Method of Discharge Starting Electric Field Intensity IV (kV/mm)

Discharge gas is supplied to a discharge space between the electrodes, and when electric field intensity applied to the electrodes is increased, electric field intensity at which discharge starts is defined as discharge starting electric field intensity IV. The measuring device is the same as described above.

Position where the high frequency voltage probe and the oscilloscope are located is shown in FIG. 1 illustrated later.

When discharge conditions in the invention are employed, even a gas with high discharge starting electric field intensity such as a nitrogen gas can start discharge, and stable plasma with high density is maintained to form a layer with high performance.

When discharge gas is a nitrogen gas, its discharge starting electric field intensity IV (1/2 Vp-p) is approximately 3.7 kV/mm, and the nitrogen gas can be excited by application of a first high frequency electric field intensity $V_1$ of not less than 3.7 kV/mm to be in plasma state The frequency of the first power supply is preferably not more than 200 kHz. The electric field waveform may be a pulse wave or a continuous wave. The lower limit of the frequency is preferably about 1 kHz.

The frequency of the second power supply is preferably not less than 800 kHz. As the frequency of the second power supply is higher, plasma density is higher, resulting a layer with higher quality. The upper limit of the frequency is preferably about 200 MHz.

The application of high frequency electric field from two power supplies as described above is important in the invention. That is, the first high frequency electric field starts discharge of a discharge gas having a high discharge starting electric field intensity, and the high frequency and high power density of the second high frequency electric field increases plasma density to obtain a layer with high density and high quality. Further, the power density of the second high frequency electric field can be increased while uniform discharge is maintained, by increasing employing the power density of the first high frequency electric field, whereby more uniform plasma with higher density can be produced, resulting in improvement of layer formation speed and layer quality.

In the atmospheric pressure plasma discharge treatment apparatus in the invention, the first filter has a function that current of a first high frequency electric field is easy to flow from the first power supply to the first electrode, and current of the second high frequency electric field being grounded, current of a second high frequency electric field is difficult to flow from the second power supply to the first power supply. The second filter has a function that current of a second high frequency electric field is easy to flow from the second electrode, and current of the first high frequency electric field being grounded, current of the first high frequency electric field is difficult to flow from the first power supply to the second power supply. In the invention, the filter having the function described above can be used without any limitations.

As the first filter, a capacitor of from several tens of pF to tens of thousands of pF or a coil with several μH can be used according to the frequency of the second power supply. As the second filter, a coil of not less than 10 μH can be used according to the frequency of the first power supply. The coil is connected to the capacitor and one terminal of the connected is connected to the power supply and another terminal thereof is grounded whereby the filter is formed.

As one embodiment of the atmospheric pressure-plasma treatment apparatus used in the invention, there is the apparatus as described above in which a discharge gas and a layer formation gas supplied to a discharge space between two electrodes opposed to each other is excited in plasma state by discharge, and a substrate moving or standing still at the space is exposed to the plasma to form a layer on the substrate. As another embodiment of the atmospheric pressure plasma treatment apparatus of the invention, there is an apparatus employing a jet process in which gas supplied to a discharge space between two electrodes opposed to each other is excited in plasma state by discharge, the resulting plasma is jetted outside the discharge space, and a substrate (which may move or stand still) at the vicinity of the electrodes is exposed to the jetted plasma to form a layer on the substrate.

FIG. 1 shows a schematic drawing of one embodiment of the atmospheric pressure plasma discharge treatment apparatus employing a jet process useful for the invention.

Figure 2:
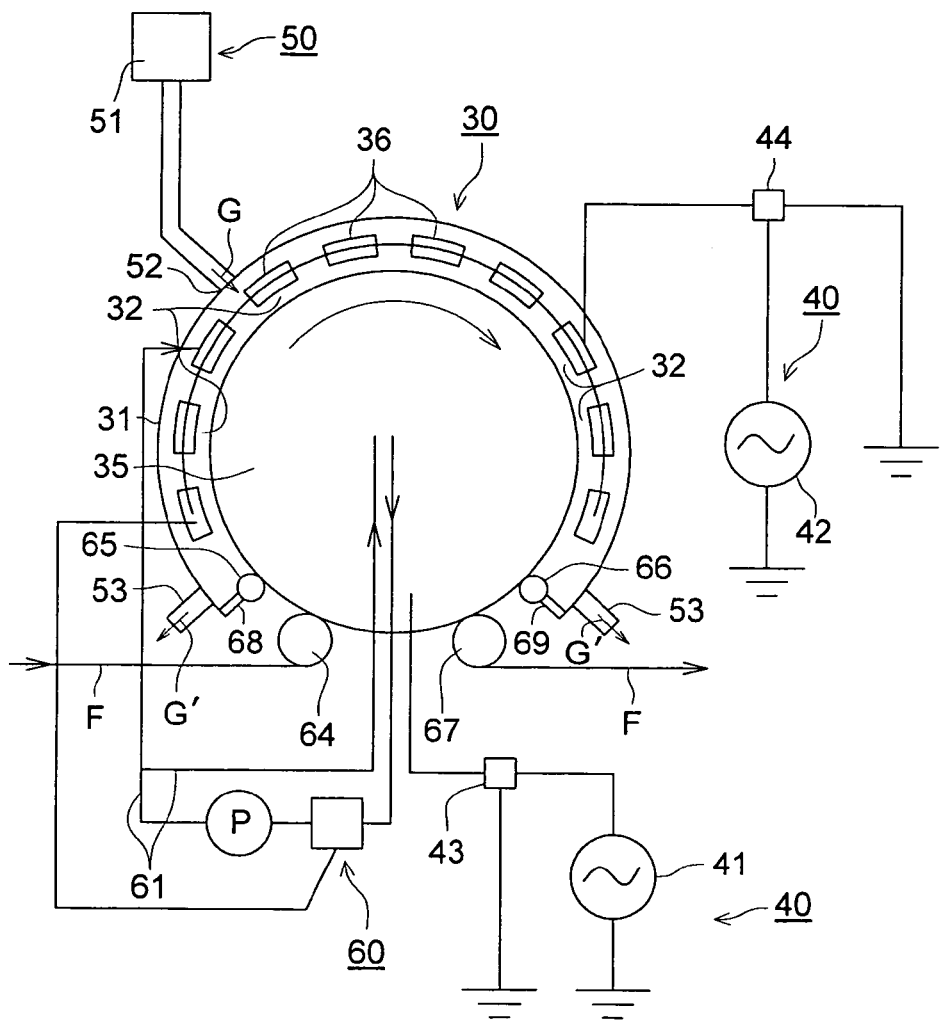
FIG. 2 shows a schematic drawing of one embodiment of the atmospheric pressure plasma discharge treatment apparatus of the invention employing a process treating a substrate at a space between opposed electrodes.

The atmospheric pressure plasma discharge treatment apparatus, employing a jet process, comprises, besides a plasma discharge treatment apparatus and an electric field application means comprising two power supplies, a gas supply means and an electrode temperature control means (each not illustrated in FIG. 1, but illustrated in FIG. 2).

The plasma discharge treatment apparatus 10 comprises a first electrode 11 and a second electrode 12 opposed to each other, in which a first high frequency electric field with frequency $\omega_1$, electric field intensity $V_1$ and current $I_1$ is applied to the first electrode 11 from the first power supply 21, and a second high frequency electric field with frequency $\omega_2$, electric field intensity $V_2$ and current $I_2$ is applied to the second electrode 12 from the second power supply 22. The first power supply 21 has ability capable of applying a high frequency electric field intensity higher than that of the second power supply 22 ($V_1 > V_2$). Further, the first power supply 21 has ability capable of applying a first frequency $\omega_1$ lower that second frequency $\omega_2$ of the second power supply 22.

A first filter 23 is provided between the first electrode 11 and the first power supply 21, which is designed so that the current from the first power supply 21 to the first electrode 11 is easy to flow and the second power supply being grounded, current from the second power supply 22 to the first power supply 21 is difficult to flow.

A second filter 24 is provided between the second electrode 12 and the second power supply 22, which is designed so that the current from the second power supply 22 to the second electrode is easy to flow, and the first power supply 21 being grounded, current from the first power supply 21 to the second power supply is difficult to flow.

Gas G is introduced a discharge space 13 between the first electrode 11 and the second electrode 12 through a gas supply means (not illustrated in FIG. 1, but illustrated in FIG. 3), a high frequency voltage is applied to the electrodes 11 and 12 to induce discharge and generate gas in a plasma state, the gas in a plasma state is jetted under the electrodes and the treatment space formed between the lower surface of the electrodes and a substrate F is charged with the gas Go in a plasma state, the substrate F conveyed from a stock roll which is not illustrated or from a preceding process is treated at treatment position 14 to form a layer on the substrate. During the layer formation, the electrodes are heated or cooled by a medium transported through a pipe according to an electrode temperature control means as illustrated in FIG. 2. It is preferred that temperature during the plasma treatment is properly controlled, since physical properties or composition of the formed layer vary due to the temperature of the substrate. Insulation materials such as distilled water and oil are preferably used for a temperature control medium. It is desired that the electrodes be controlled to have a uniform temperature during the plasma discharge treatment in order to minimize temperature unevenness in the width and longitudinal directions of the substrate.

The measuring device for measuring the high frequency electric field intensity (application electric field intensity) and the discharge starting electric field intensity is shown in FIG. 1. Numerical numbers 25 and 26 are high frequency voltage probes, and numerical numbers 27 and 28 are oscilloscopes.

Since plural atmospheric pressure plasma discharge treatment apparatuses employing a jet process can be provided in series, gases in the same plasma state can be generated simultaneously, and the substrate can be treated repeatedly and at high speed.

FIG. 2 shows a schematic drawing of one embodiment of the atmospheric pressure plasma discharge treatment apparatus employing a process treating a substrate at a space between opposed electrodes useful for the invention.

The atmospheric pressure plasma discharge treatment apparatus of the invention comprises a plasma discharge treatment apparatus 30, an electric field application means 40 comprising two power supplies, a gas supply means 50 and an electrode temperature control means 60.

In FIG. 2, substrate F is subjected to plasma discharge treatment at a discharge space 32 between a roll electrode (first electrode) 35 and a group of fixed prismatic electrodes (a second electrode) 36 to form a layer on the substrate.

High frequency electric field is applied to a discharge space between a roll electrode (first electrode) 35 and a group of fixed prismatic electrodes (a second electrode) 36, where a high frequency electric field with frequency $\omega_1$, electric field intensity $V_1$ and current $I_1$ is applied to a roll electrode (first electrode) 35 through a first power supply 41, and a high frequency electric field with frequency $\omega_2$, electric field intensity $V_2$ and current $I_2$ is applied to a group of fixed prismatic electrodes (a second electrode) 36 through a second power supply 42.

A first filter 43 is provided between a roll electrode (first electrode) 35 and the first power supply 41, and the first filter 43 is designed so that current from the first power supply 41 is easy to flow in the first electrode, and current from the second power supply 42 is difficult to flow to the first power supply, the second power supply 42 being grounded. A second filter 44 is provided between a group of fixed prismatic electrodes (a second electrode) 36 and the second power supply 42, and the second filter 44 is designed so that the current from the second power supply 42 is easy to flow in the second electrode, and current from the first power supply 41 is difficult to flow to the second power supply, the first power supply 41 being grounded.

In the invention, the roll electrode 35 and a group of fixed prismatic electrodes 36 may be regarded as a second electrode and a first electrode, respectively. In either case, the first power supply is connected to the first electrode, and the second power supply is connected to the second electrode. It is preferred that the first power supply has ability capable of supplying strength of a high frequency electric field $(V_1 > V_2)$ higher than that of the second power supply. Further, the first frequency $\omega_1$ is lower than the second frequency $\omega_2$.

It is preferred that $I_2$ is more than $I_1$. Current $I_1$ of the first high frequency electric field is preferably 0.3 to 20 mA/cm$^2$, and more preferably 1.0 to 20 mA/cm$^2$. Current $I_2$ of the second high frequency electric field is preferably 10 to 100 mA/cm$^2$, and more preferably 20 to 100 mA/cm$^2$.

Gas G generated in gas generating device 51 in gas supply means 50 is introduced from gas supply port 52 to plasma discharge vessel 31, the gas supply amount being controlled.

The substrate F is conveyed from a preceding process or from a stock roll which is not illustrated, passed through guide roller 64 and through nip roller 65, which removes air accompanying the substrate, and transported to a space between a group of the fixed prismatic electrodes 36 and the roll electrode 25. Electric field is applied to both the roll electrode (first electrode) 35 and a group of fixed prismatic electrodes (second electrode) 36 to generate plasma at discharge space 32 between the opposed electrodes. The substrate F is exposed to gas in a plasma state to form a layer on the substrate, while transported so that the substrate contacts the surface of the roll electrode. Then, the substrate F is transported through nip roller 66 and guide roller 67 to the uptake roller, which is not illustrated, or to the next process.

Waste gas G', which has been used for discharge treatment, is exhausted from exhaust port 53. In order to heat or cool the roll electrode (first electrode) 35 and a group of fixed prismatic electrodes (second electrode) 36, a the roll electrode (first electrode) 35 and a group of fixed prismatic electrodes (second electrode) 36, a medium whose temperature is adjusted by the electrode temperature control means 60 is supplied through tube 61 to both first and second electrodes employing a pump P. Numerical numbers 68 and 69 are partition plates for separating the plasma discharge vessel 31 from the exterior.

Figure 3:
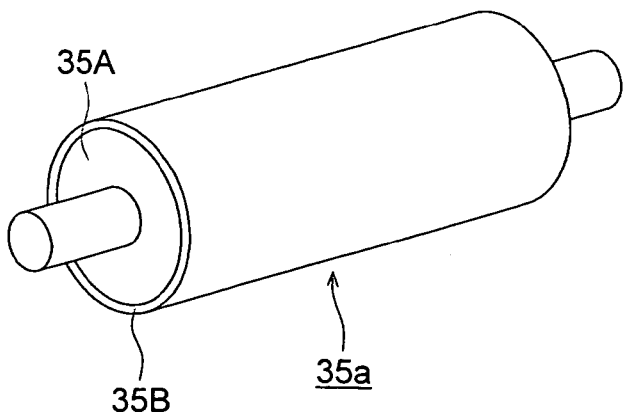
FIG. 3 shows a perspective view of one embodiment of a roll electrode in which a dielectric layer is coated on a conductive metal base material.

FIG. 3 shows a perspective view of one embodiment of a roll electrode shown in FIG. 2 in which a dielectric layer is coated on a conductive metal base material.

In FIG. 3, roll electrode 35a is comprised of conductive metal base material 35A and a dielectric layer 35B coated thereon. The roll electrode is constructed so that a medium (for example, water or silicon oil) for controlling temperature can be circulated in order to control the temperature of the electrode surface during plasma discharge treatment.

Figure 4:
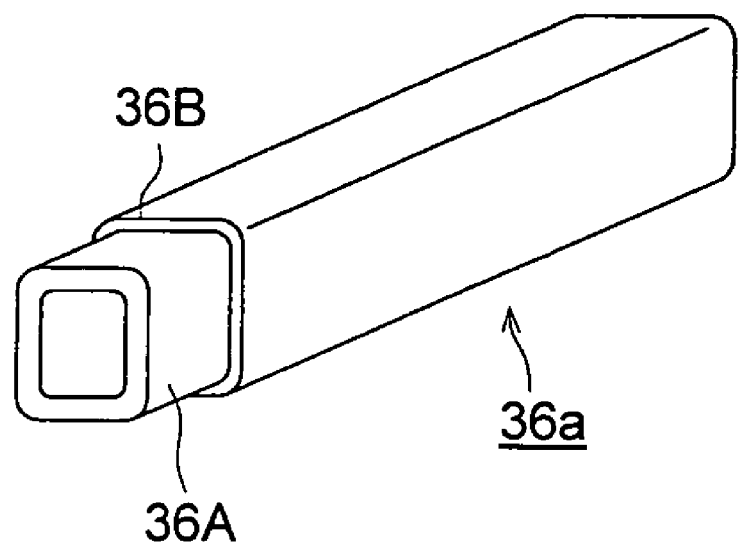
FIG. 4 shows a perspective view of one embodiment of a prismatic electrode in which a dielectric layer is coated on a conductive metal base material.

FIG. 4 shows a perspective view of one embodiment of a prismatic electrode in which a dielectric layer is coated on a conductive metal base material.

In FIG. 4, prismatic electrode 36a is comprised of conductive metal base material 36A and a dielectric layer 36B coated thereon, as in FIG. 3. The prismatic electrode is hollow, forming a jacket so that temperature control can be carried out during discharge.

Plural fixed prismatic-electrodes are provided on a circumference of a circle greater than the roll electrode circle, and the discharge surface area of the prismatic electrodes is the sum of the areas of the surfaces of the electrodes facing the roll electrode.

The prismatic electrodes 36a illustrated in FIG. 2 may be replaced with cylindrical electrodes, but the prismatic electrodes are preferred since they form broader discharge surfaces as compared with the cylindrical electrodes.

In FIGS. 3 and 4, roll electrode 35a and prismatic electrode 36a are electrodes in which conductive metal base materials 35A and 36B are coated with dielectric layers 35B and 36B, the coating being carried out by thermally spraying ceramic on the base roll to form a ceramic layer, and sealing the ceramic layer with sealing materials such as inorganic compounds. The thickness of the ceramic dielectric layer is sufficient if it is about 1 mm. The ceramic material used for thermal spraying is preferably alumina, silicon nitride, and more preferably alumina in view of easy processability. The dielectric layer may be provided on a conductive base roll by lining of inorganic materials.

Examples of conductive metal base materials 35A and 36A include metals such as titanium, a titanium alloy, silver, platinum, stainless steel, aluminum, or iron, a composite of iron and ceramic, and a composite of aluminum and ceramic. Titanium or a titanium alloy is preferable for the reason described later.

The space distance between the first and second electrodes opposed to each other, when only one of the opposed electrodes has a dielectric layer, is a minimum distance between the electric layer surface and the conductive metal base material surface of the other electrode. The space distance, when both opposed electrodes described above have a dielectric layer, is a minimum distance between the both dielectric layer surfaces. The space distance is determined considering thickness of a dielectric layer provided on the conductive metal base material, magnitude of strength of electric field applied, or an object of employing plasma. The space distance is preferably from 0.1 to 20 mm, and more preferably from 0.5 to 2 mm, in carrying out uniform discharge.

The conductive metal base material and the dielectric layer in the invention will be explained in detail below.

The vessel used in the plasma discharge vessel 31 is preferably a vessel of pyrex (R) glass, but a vessel of metal may be used if insulation from the electrodes is secured. For example, the vessel may be a vessel of aluminum or stainless steel laminated with a polyimide resin or a vessel of the metal which is thermally sprayed with ceramic to form an insulation layer on the surface. In FIG. 1, the side of the two electrodes opposed in parallel to each other is preferably coated with the materials as described above.

Examples of the first power supply (high frequency power supply) equipped in the atmospheric pressure plasma treatment apparatus of the invention include the following power supplies available on the market:

| Power supply No. | Maker | Frequency | Trade name |
|---|---|---|---|
| A1 | Shinko Denki | 3 kHz | SPG3-4500 |
| A2 | Shinko Denki | 5 kHz | SPG5-4500 |
| A3 | Kasuga Denki | 15 kHz | AGI-023 |
| A4 | Shinko Denki | 50 kHz | SPG50-4500 |
| A5 | Heiden Kenkyusho | 100 kHz* | PHF-6k |
| A6 | Pearl Kogyo | 200 kHz | CF-2000-200k |
| A7 | Pearl Kogyo | 400 kHz | CF-2000-400k |

Any power supply of the above can be used in the invention.

Examples of the second power supply (high frequency power supply) include the following power supplies available on the market:

| Power supply No. | Maker | Frequency | Trade name |
|---|---|---|---|
| B1 | Pearl Kogyo | 800 kHz | CF-2000-800k |
| B2 | Pearl Kogyo | 2 MHz | CF-2000-2M |
| B3 | Pearl Kogyo | 13.56 MHz | CF-2000-13M |
| B4 | Pearl Kogyo | 27 MHz | CF-2000-27M |
| B5 | Pearl Kogyo | 150 MHz | CF-2000-150M |

Any power supply of the above can be used in the invention. In the power supplies above, "*" above represents an impulse high frequency power supply (100 kHz in continuous mode) manufactured by Heiden Kenkyusho, and others are high frequency power supplies capable of applying electric field with only continuous sine wave.

In the invention, it is preferred that electrodes, which are capable of maintaining stable discharge when the electric field as described above is applied thereto, be installed in the atmospheric pressure plasma discharge treatment apparatus.

In the invention, when power is supplied across the opposed electrodes, power (power density) of not less than 1 W/cm$^2$ is supplied to the second electrode (the second high frequency electric field) to excite discharge gas, generate plasma, and give the resulting energy to a layer formation gas to form a layer. The upper limit of power supplied to the second electrode is preferably 50 W/cm$^2$, and more preferably 20 W/cm$^2$. The lower limit of power supplied is preferably 1.2 W/cm$^2$. The discharge surface area (cm$^2$) refers to the surface area of the electrode at which discharge occurs.

Further, power density can be improved while uniformity of the second high frequency electric field is maintained, by supplying power (power density) of not less than 1 W/cm$^2$ to the first electrode (first high frequency electric field), whereby more uniform plasma with higher density can be produced, resulting in improvement of layer formation speed and layer quality. Power supplied to the first electrode is preferably not less than 5 W/cm$^2$. The upper limit of power supplied to the first electrode is preferably 50 W/cm$^2$.

Herein, the waveform of the high frequency electric field is not specifically limited. There are a continuous oscillation mode (called a continuous mode) with a continuous sine wave and a discontinuous oscillation mode (called a pulse mode) carrying ON/OFF discontinuously, and either may be used, but a method supplying the continuous sine wave at least to the second electrode side (the second high frequency electric field) is preferred in obtaining a uniform layer with high quality.

It is necessary that electrodes used in the atmospheric pressure plasma layer formation method structurally and functionally resist the use under severe conditions. Such electrodes are preferably those in which a dielectric is coated on a metal base material.

In the dielectric coated electrode used in the invention, the dielectric and metal base material used in the invention are preferably those in which their properties meet. For example, one embodiment of the dielectric coated electrodes is a combination of conductive metal base material and a dielectric in which the difference in linear thermal expansion coefficient between the conductive base material and the dielectric is not more than 10×10$^{-6}$/° C. The difference in linear thermal expansion coefficient between the conductive metal base material and the dielectric is preferably not more than $8\times10^{-6}/°$ C., more preferably not more than $5\times10^{-6}/°$ C., and most preferably not more than $2\times10^{-6}/°$ C. Herein, the linear thermal expansion coefficient is a known physical value specific to materials.

Combinations of conductive base material and dielectric having a difference in linear thermal expansion coefficient between them falling within the range as described above will be listed below.

(1) A combination of pure titanium or titanium alloy as conductive metal base material and a thermal spray ceramic layer as a dielectric layer (2) A combination of pure titanium or titanium alloy as conductive metal base material and a glass lining layer as a dielectric layer (3) A combination of stainless steel as conductive metal base material and a thermal spray ceramic layer as a dielectric layer (4) A combination of stainless steel as conductive metal base material and a glass lining layer as a dielectric layer (5) A combination of a composite of ceramic and iron as conductive metal base material and a thermal spray ceramic layer as a dielectric layer (6) A combination of a composite of ceramic and iron as conductive metal base material and a glass lining layer as a dielectric layer (7) A combination of a composite of ceramic and aluminum as conductive metal base material and a thermal spray ceramic layer as a dielectric layer (8) A combination of a composite of ceramic and aluminum as conductive metal base material and a glass lining layer as a dielectric layer In view of the difference in the linear thermal expansion coefficient, the combinations of (1), (2), and (5) through (8) above are preferred, and the combination of (1) above is more preferred.

In the invention, titanium or titanium alloy is especially preferred. The electrode in which the above described dielectric is coated on the titanium or titanium alloy as a metal base material can resist the long term use under severe conditions without causing cracking, peeling or exfoliation.

The metal base material used in the invention is a titanium alloy or a titanium metal each containing not less than 70% by weight of titanium. The titanium content of the titanium alloy or titanium metal in the invention may be not less than 70% by weight, but is preferably not less than 80% by weight. As the titanium alloy or titanium metal in the invention, those generally used such as pure titanium for industrial use, corrosion resistant titanium, and high strength titanium. Examples of the titanium for industrial use include TIA, TIB, TIC and TID, each of which contains a minute amount of an iron atom, a carbon, atom, a nitrogen atom, an oxygen atom or a hydrogen atom and not less than 99% by weight of titanium. The corrosion titanium is preferably T15PB, which contains a minute amount of the atom described above or lead, and not less than 98% by weight of titanium. The titanium alloy is preferably T64, T325, T525 or TA3, each of which contains a minute amount of the atom described above except for lead, aluminum, vanadium or tin, and not less than 85% by weight of titanium. Coefficient of thermal expansion of the titanium alloy or titanium metal described above is almost a half of that of stainless steel, for example, AISI316. The titanium alloy or titanium metal, which is used as a metal base material, is well combined with a dielectric described later, where the dielectric layer is coated on the metal base material, which provide high heat resistance and high durability.

The dielectric in the invention is preferably an inorganic compound having a dielectric constant of from 6 to 45 as its characteristics. Examples of such an electrode include ceramic such as alumina or silicon nitride, and a glass lining material such as silicate glass or borate glass. Of these, a dielectric layer is coated on the electrode preferably by thermal spraying of ceramic or by glass-lining, and more preferably by thermal spraying of alumina.

As one embodiment of electrodes capable of resisting a high electric power as described above, the electrode has a dielectric layer with a void volume of not more than 10% by volume, preferably not more than 8% by volume, and most preferably from more than zero to 5% by volume. The void volume of the dielectric layer can be measured employing a BET adsorption method or a mercury porosimeter. In the examples described later, the void volume of a dielectric layer coated on a conductive metal base material was measured employing a Mercury Porosimeter produced by Shimazu Seisakusho Co., Ltd. The dielectric layer having a low void volume provided high durability. A dielectric layer having voids whose volume is low is, for example, a thermally sprayed ceramic layer with high density and high adhesion prepared according to an atmospheric plasma method as described later. In order to further reduce the void volume, a sealing treatment is preferably carried out.

The atmospheric plasma spraying method refers to a technique in which fine particles or wires of ceramic etc. are introduced into a source of plasma heat to form a melted or semi-melted particles, and the resulting particles are sprayed to a metal base material on which a layer is to be formed. The source of plasma heat herein referred to is a high temperature plasma gas obtained by heating gas molecules to high temperature to dissociate into atoms and applying further energy thereto to release electrons. The spraying speed of this plasma gas is high, and therefore the sprayed gas colloids the metal base material with a spray speed higher than that of a conventional arc spraying or a flame spraying, providing a layer with high adhesion and higher density. A spraying method disclosed in Japanese Patent O.P.I. Publication Nos. 2000-301655 can be referred to in which a heat shielding layer is formed on material heated to high temperature. The method described above can form a dielectric layer (thermally sprayed ceramic layer) having the void volume as described above.

Another preferred embodiment of the dielectric coated electrodes of the invention capable of resisting high power is a dielectric coated electrode in which the dielectric layer has a thickness of from 0.5 to 2 mm. The variation of the dielectric layer thickness is preferably not more than 5%, more preferably not more than 3%, and still more preferably not more than 1%.

In order to further reduce the void volume of the dielectric layer, it is preferred that a thermally sprayed layer such as the thermally sprayed ceramic layer is subjected to sealing treatment employing an inorganic compound. The inorganic compound is preferably a metal oxide, and more preferably one containing a silicon oxide (SiOx) as a main component.

The inorganic compound for sealing is preferably one being hardened through sol-gel reaction. When an inorganic compound for sealing is a compound containing a metal oxide as a main component, a metal alkoxide is coated on the ceramic spray layer as a sealing solution, and hardened through sol gel reaction. When the inorganic compound for sealing is a compound containing silica as a main component, an alkoxysilane is preferably used as a sealing solution.

In order to accelerate the sol gel reaction, energy treatment is preferably carried out. Examples of the energy treatment include heat hardening (hardening at not more than 200° C.) or UV irradiation. A sealing method, in which the alternate coating and hardening of diluted sealing solution are repeated several times, provides an electrode with improved inorganic property, with high density and without any deterioration.

When in the preparation of the dielectric coated electrode of the invention, a metal oxide solution as a sealing solution is coated on a thermally sprayed ceramic layer and subjected to sealing treatment in which hardening is carried out through sol gel reaction, the metal oxide content after hardening is preferably not less than 60 mol %. When an alkoxysilane is used as a metal alkoxide of a sealing solution, the content of SiOx (x: not more than 2) after hardening is preferably not less than 60 mol %. The content of SiOx (x: not more than 2) after hardening is measured analyzing the section of the dielectric layer through an XPS (X-ray photoelectron spectroscopy).

In the electrode used in the layer formation method of the invention, the surface of the electrode on the side contacting a substrate preferably has a maximum surface roughness Rmax (defined according to JIS B 0601) of not more than 10 μm, in obtaining the effects disclosed in the invention. The maximum surface roughness Rmax is more preferably not more than 8 μm, and still more preferably not more than 7 μm.

The electrode is surface finished by polishing treatment so as to obtain such a maximum surface roughness Rmax as described above, which makes it possible to maintain the dielectric layer thickness or a gap between the electrodes constant, provide stable discharge, and provide an electrode with greatly increased durability, with high precision and without strain or cracking due to thermal shrinkage difference or residual stress. It is preferred that at least the surface of the dielectric layer on the side contacting the substrate is surface finished by polishing. Further, the surface of the electrode has a center line average surface roughness Ra (also defined according to JIS B 0601) of preferably not more than 0.5 μm, and more preferably not more than 0.1 μm.

Another preferred embodiment of the dielectric coated electrodes used in the invention capable of resisting high electric power is one having a heat resistant temperature of not less than 100° C., preferably not less than 120° C., and more preferably not less than 150° C. The upper limit of the heat resistant temperature is 500° C. The heat resistant temperature herein refers to a highest temperature capable of carrying out normal discharge without causing dielectric breakdown. The above heat resistant temperature can be attained by employing a dielectric layer formed according to the thermal spray of ceramic as described above, by employing a dielectric layer comprised of two or more layers, which differ in foam content, formed according to the glass-lining as described above, or by properly selecting conductive metal base materials and dielectrics in which the difference in linear thermal expansion coefficient between the conductive base materials and dielectrics falls within the range as described above.

Gas supplied to a discharge space will be explained below.

The gas contains a discharge gas and a layer formation gas. The discharge gas and layer formation gas may be supplied separately or as an admixture thereof.

The discharge gas is a gas capable of inducing glow discharge for layer formation. Examples of the discharge gas include a nitrogen gas, rare gas, air, a hydrogen gas, and an oxygen gas, and these may be used singly or in combination.

In the invention, the discharge gas is preferably a nitrogen gas. The discharge gas is preferably a gas containing 50 to 100% by volume of a nitrogen gas. It is preferred that the discharge gas contains less than 50% by volume of rare gas as a gas other than a nitrogen gas. The discharge gas content of the total gas supplied to the discharge space is preferably from 90 to 99.9% by volume.

The layer formation gas is a material for forming a layer on a substrate, and is excited to form activated species which are chemically piled on the substrate.

A mixed gas for layer formation used in the invention will be explained below. The mixed gas is fundamentally a mixed gas of discharge gas and layer formation gas, but may further contain an addition gas. The discharge gas content of the mixed gas is preferably from 90 to 99.9% by volume.

The layer formation gases used in the invention include an organometallic compound, a metal halide compound, and a metal hydride compound.

The organometallic compound used in the invention is preferably a compound represented by the following formula (I):

$$R^1{}_xMR^2{}_yR^3{}_z \qquad \text{Formula (I)}$$

wherein M represents a metal with a coordination position number of m in which m is an integer of not less than 1, $R^1$ represents an alkyl group, $R^2$ represents an alkoxy group, $R^3$ represents a radical selected from the group consisting of β-diketone, β-ketocarboxylic acid ester, β-ketocarboxylic acid, and ketoxy, x, y and z independently represent an integer of from 0 to m, provided that that when x, y or z is two or more, plural $R^1$, $R^2$ or $R^3$ may be the same or different, and provided that x+y+z=m, and x, y and z are not simultaneously zero. "m" is preferably not more than 8. Examples of the alkyl group of $R^2$ include a methyl group, an ethyl group, a propyl group, and a butyl group. Examples of the alkoxy group of $R^2$ include a methoxy group, an ethoxy group, a propoxy group, a butoxy group, and 3,3,3-trifluoropropoxy group. A hydrogen atom of the alkyl group may be substituted with a fluorine atom. Examples of the β-diketone of $R^3$ include 2,4-pentanedione (called acetylacetone or acetoacetone, also), 1,1,1,5,5,5-hexamethyl-2,4-pentanedione, 2,2,6,6-tetramethyl-3,5-heptanedione, and 1,1,1-trifluoro-2,4-pentanedione. Examples of the βketocarboxylic acid ester include acetoacetic acid methyl ester, acetoacetic acid ethyl ester, acetoacetic acid propyl ester, trimethylacetoacetic acid ethyl ester, and trifluoroacetoacetic acid methyl ester. Examples of the β-ketocarboxylic acid include acetoacetic acid trimethylacetoacetic acid. Examples of the ketoxy include acetoxy, propionyloxy, acryloyloxy and methacroyloxy. The total carbon atom number of these groups in the organometallic compound is preferably not more than 18. As is exemplified above, these groups may be straight chained or branched or the hydrogen atom thereof may be substituted with a fluorine atom.

The organometallic compound in the invention is preferably a less explosive compound in view of its handling. The organometallic compound in the invention is preferably an organometallic compound having one or more oxygen atoms in the molecule. Examples of such an organometallic compound include an organometallic compound having at least one alkoxy group in the molecule, or an organometallic compound having at least one selected from the group consisting of a β-diketone complex group, a β-ketocarboxylic acid ester complex group, a β-ketocarboxylis acid complex group, and a ketoxy group (a ketoxy complex group).

The typical organometallic compound will be explained later.

In the invention, the gas supplied to the discharge space may contain an addition gas for accelerating a layer formation reaction, besides the discharge gas and layer formation gas. Examples of the addition gas include oxygen, ozone, hydrogen peroxide, carbon dioxide, carbon monoxide, hydrogen, and ammonia. Oxygen, carbon monoxide, and hydrogen are preferred, and the gas supplied to the discharge space preferably contains a gas selected from these. The content of the addition gas in the gas supplied to the discharge space is preferably 0.01 to 5% by volume, which accelerates the layer formation and forms a layer with high density and high quality.

The thickness of the layer formed above, which is comprised of oxides or complex compounds, is preferably from 0.1 to 1000 nm.

In the invention, examples of the metal in the organometallic compound, metal halide or metal hydride compound, which is used in the layer formation gas, include Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, and Lu., and the organometallic compound is preferably one selected from a metal alkoxide, an alkylated metal, and a metal complex.

Various layers with high performance can be obtained using the metal compound such as the organometallic compound, metal halide or metal hydride compound described above, together with the discharge gas in the layer forming method of the invention. One example of the layer in the invention will be shown below, but the invention is not limited thereto.

Electrode layer: Au, Al, Ag, Ti, Ti, Pt, Mo, Mo—Si
Dielectric protective layer: $SiO_2$, SiO, $Si_3N_4$, $Al_2O_3$, $Al_2O_3$, $Y_2O_3$
Transparent conductive layer: $In_2O_3$, $SiO_2$
Electrochromic layer: $WO_3$, $IrO_2$, $MoO_3$, $V_2O_5$
Fluorescent layer: ZnS, ZnS+ZnSe, ZnS+CdS
Magnetic recording layer: Fe—Ni, Fe—Si—Al, $\gamma$-$Fe_2O_3$, Co, $Fe_3O_4$, Cr, $SiO_2$, $AlO_3$
Superconductive layer: Nb, Nb—Ge, NbN
Solar battery layer: a-Si, Si
Reflection layer: Ag, Al, Au, Cu
Selective absorption layer: ZrC—Zr
Selective transparent layer: $In_2O_3$, $SnO_2$
Anti-reflection layer: $SiO_2$, $TiO_2$, $SnO_2$
Shadow mask: Cr
Anti-abrasion layer: Cr, Ta, Pt, TiC, TiN
Anti-corrosion layer: Al, Zn, Cd, Ta, Ti, Cr
Heat resistant layer: W, Ta, Ti
Lubricant layer: $MoS_2$
Decoration layer: Cr, Al, Ag, Au, TiC, Cu In the invention, metal contained in the preferred metal compounds is Si (silicon), Ti (titanium), Sn (tin), Zn (zinc), In (indium), or Al (aluminum). Among the metal compounds containing this metal, the organometallic compound represented by formula (I) as shown above is preferred. Examples of the organometallic compound will be listed later.

Among the layers with high performance described above, an anti-reflection layer or a multi-layered anti-reflection layer used in an anti-reflection film and a transparent conductive layer used in a transparent conductive film will be explained in detail below.

Among the layers with high performance, the anti-reflection layer of the antireflection film is comprised of a medium refractive index layer, a high refractive index layer, and a low refractive index layer.

In the gas material for forming the anti-reflection layer in the invention, a titanium compound for forming a high refractive index layer, a tin compound for forming a medium refractive index layer, and a silicon compound for forming a low refractive index layer will be explained below. The antireflection film having an anti-reflection layer is obtained forming each refractive index layer on a substrate directly or through another layer. The layer formation is carried out for example, employing an atmospheric pressure plasma treatment apparatus shown in FIG. 2, the medium, high and low refractive index layers being continuously formed in that order employing three of the apparatuses connected in series. This continuous layer formation is suitable for layer formation in the invention in view of stabilized quality and excellent productivity. A successive layer formation method may be used in which every time a first layer is formed on a substrate, the substrate is wound around a spool, and the substrate is unwound from the spool and then a second layer is formed on the first layer. In the invention, when an anti-stain layer is provided on the anti-reflection layer, the anti-stain layer may be formed employing another one atmospheric pressure plasma treatment apparatus arranged after the above three apparatuses to provide four apparatuses connected in series. Before forming the anti-reflection layer on a substrate, a hard coat layer or an anti-glare layer may be provided on the substrate, or a back coat layer may be coated on the surface of the substrate opposite the hard coat layer or the anti-glare layer.

As the gas material for forming the anti-reflection layer of the anti-reflection layer in the invention, any compound can be used without limitation as long as it can provide a proper refractive index. In the invention, the gas material for forming a high refractive index layer is preferably a titanium compound, the gas material for forming a medium refractive index layer is preferably a tin compound or a mixture of a titanium compound and a silicon compound (the medium refractive index layer may be a laminate of the high refractive index titanium compound layer and the low refractive index silicon compound layer), and the gas material for forming a low refractive index layer is preferably a silicon compound, a fluorine-containing compound or a mixture of silicon compound, a fluorine-containing compound. Two or more kinds of these compounds may be used in any of the layers as a layer formation gas in order to adjust refractive index in its layer.

As the tin compound used in the gas material for forming a medium refractive index layer useful for the invention, there are an organic tin compound, a tin hydride compound and a tin halide. Examples of the organic tin compound include dibutyldiethoxytin, butyltin tris(2,4-pentanedionato), tetraethoxytin, methyltriethoxytin, diethyldiethoxytin, triisopropylethoxytin, ethylethoxytin, methylmethoxytin, isopropylisopropoxytin, tetrabutoxytin, diethoxytin, dimethoxytin, diisopropoxytin, dibutoxytin, dibutyryloxytin, diethyltin, tetrabutyltin, tin bis(2,4-pentanedionato), ethyltin acetoacetonato, ethoxytin (2,4-pentanedionato), dimethyltin (2,4-pentanedionato), diacetomethylacetatotin, diacetoxytin, dibutoxydiacetoxytin, and diacetoxytin diacetoacetonato. Examples of the tin hydride compound include tin hydride. Examples of the tin halide include tin dichloride and tin tetrachloride. These compounds can be preferably used in the invention. The tin compound layer is also useful for an antistatic layer, since its surface specific resistance can be reduced to not more than $10^{11}$ Ω/cm².

As the titanium compound used in the gas material for forming a high refractive index layer useful for the invention, there are an organotitanium compound, a titanium hydride compound and a titanium halide. Examples of the organotitanium compound include triethoxytitanium, trimethoxytitanium, triisopropoxytitanium, tributoxytitanium, tetraethoxytitanium, tetraisopropoxytitanium, methyldimethoxytitanium, ethyltriethoxytitanium, methyltripropoxytitanium, triethyltitanium, triisopropyltitanium, tributyltitanium, tetraethyltitanium, tetraisopropyltitanium, tetrabutyltitanium, tetradimethylaminotitanium, dimethyltitanium di(2,4-pentanedionato), ethyltitanium tri(2,4-pentanedionato), titanium tris(2,4-pentanedionato), titanium tris(acetomethylacetato), triacetoxytitanium, dipropoxypropionyloxytitanium, dibutyryloxytitanium. Examples of the titanium hydride compound include monotitanium hydride, and dititanium hydride. Examples of the titanium halide compound include trichlorotitanium, and tetrachlorotitanium. The above compounds are preferably used in the invention. These layer formation gases can be used as an admixture of two or more kinds thereof.

As the silicon compound used in the gas material for forming a low refractive index layer useful for the invention, there are an organosilicon compound, a silicon hydride compound and a silicon halide. Examples of the organosilicon compound include tetraethylsilane, tetramethylsilane, tetraisopropylsilane, tetrabutylsilane, tetraethoxysilane, tetraisopropoxysilane, tetrabutoxysilane, dimethyldimethoxysilane, diethyldiethoxysilane, diethylsilane di(2,4-pentanedionato), methyltrimethoxysilane, methyltriethoxysilane, and ethyltriethoxysilane. Examples of the silicon hydride compound include silane tetrahydride and disilane hexahydride. Examples of the silicon halide compound include tetrachlorosilane, methyltrichlorosilane, and diethyldichlorosilane. Any of the above compounds are preferably used in the invention. These layer formation gases can be used as an admixture of two or more kinds thereof. Further, a proper mixture of two or more kinds of the tin compound, titanium compound, and silicon compound can be used in order to adjust refractive index of the layer.

As the organotin compound, organosilicon compound or organotitanium compound described above, a metal hydride compound or a metal alkoxide compound is preferably used in view of handling, and the metal alkoxide compound is more preferably used, since it is not corrosive, and generates no harmful gas nor causes contamination. When the organotin compound, organosilicon compound or organotitanium compound described above is introduced into a discharge space or a space between the electrodes, the compound may be in the form of gas, liquid, or solid at ordinary temperature and ordinary pressure. When they are gas at ordinary temperature and ordinary pressure, they can be introduced in the discharge space as they are. When they are liquid or solid, they are gasified by heating, or under reduced pressure or ultrasonic wave radiation, and used. When the organotin compound, organosilicon compound or organotitanium compound gasified by heating is used, a metal alkoxide such as tetraethoxymetal or tetraisopropoxymetal, which is liquid at ordinary temperature and has a boiling point of not more than 200° C., is suitably used in order to form an anti-reflection layer. The above metal alkoxide may be diluted with another solvent to obtain a solution, and the resulting solution is gasified by a vaporizer and mixed with rare gas to obtain a mixed gas. The solvents include an organic solvent such as methanol, ethanol, n-hexane or a mixture thereof.

The content of the layer formation gas in the total gas supplied to the discharge space is preferably 0.01 to 10% by volume, and more preferably 0.01 to 1% by volume, in that a uniform layer is formed on a substrate by the discharge plasma treatment.

The medium refractive index layer can be formed by a proper combination of the organotin compound, organosilicon compound or organotitanium compound described above so as to obtain the intended refractive index.

The preferred refractive index or thickness of each layer is, for example, as follows.

In the medium refractive index tin oxide layer, the refractive index is from 1.6 to 1.8, and the thickness is from 50 to 70 nm. In the high refractive index titanium oxide layer, the refractive index is from 1.9 to 2.4, and the thickness is from 80 to 150 nm. In the low refractive index silicon oxide layer, the refractive index is from 1.3 to 1.5, and the thickness is from 80 to 120 nm.

Another example of the layer in the invention with high performance is a transparent conductive layer, and its formation will be explained below.

In the transparent conductive layer formation, a little different metal from that used in the anti-reflection layer described above is used, in which the metal component in the organometallic compound for layer formation is a metal such as indium which is transparent and conductive, but substantially the same organic group as contained in the organometallic compound as in the anti-reflection layer.

The metal contained in the organometallic compound for the transparent conductive layer formation is preferably at least one metal selected from the group consisting of indium (In), zinc (Zn) and tin (Sn).

In the invention, preferred examples of the preferred organometallic compound include indium tris(2,4-pentanedionate), indium tris(hexafluoropentanedionate), indium triacetoacetate, triacetoxyindium, diethoxyacetoxyindium, triisopropoxyindium, diethoxyindium (1,1,1-trifluoropentanedionate), tris(2,2,6,6-tetramethyl-3,5-heptanedionato) indium, ethoxyindium bis(acetomethylacetate), di-n-butyltin bis(2,4-pentanedionato), di-n-butyldiacetoxytin, di-t-butyldiacetoxytin, tetraisopropoxytin, tetra-i-butoxytin, and bis(acetylacetonate) zinc. These organometallic compounds, manufactured by for example, Tokyu Kasei Co. Ltd., are available on the market.

In the invention, the transparent conductive layer comprised of the organometallic compound, which contains at least one oxygen atom in the molecule, is preferably doped in order to increase its conductivity. Herein, a mixed gas of an organometallic compound gas for layer formation and an organometallic compound gas for doping is preferably used. Examples of the organometallic compound or a fluorine-containing compound for doping include isopropoxyaluminum, tris(2,4-pentanedionato)nickel, bis(2,4-pentanedionato)manganese, isopropoxyboron, tri-n-butoxyantimony, tri-n-butylantimony, di-n-butylbis(2,4-pentanedionato) tin, di-n-butyldiacetoxytin, di-t-butyldiacetoxytin, tetraisopropxytin, tetrabutopxytin, tetrabutyltin, zinc di(2,4-pentanedionate), hexafluoropropylene, octafluorocyclobutane, and carbon tetrafluoride.

The amount ratio of the organometallic compound gas necessary to form the transparent conductive layer to the above layer formation gas for doping differs due to the kinds of the transparent conductive layer. For example, when an ITO layer comprised of indium oxide doped with tin is formed, it is necessary that the layer formation gas used be adjusted so that an atomic ratio In/Sn of the ITO layer falls within the range of from 100/0.1 to 100/15. The ratio In/Sn of the ITO layer is preferably from 100/0.5 to 100/10. When a transparent conductive layer (hereinafter referred to as FTO layer) comprised of tin oxide doped with fluorine is formed, the layer formation gas used is preferably adjusted so that an atomic ratio Sn/F of the FTO layer falls within the range of from 100/0.01 to 100/50. When an $In_2O_3$—ZnO amorphous transparent conductive layer is formed, the layer formation gas used is preferably adjusted so that an atomic ratio In/Zn of the formed layer falls within the range of from 100/50 to 100/5. The atomic ratio, In/Sn, Sn/F or In/Zn is obtained by measurement according to XSP.

In the invention, the content of the gas for the transparent conductive layer in the mixed gas is preferably from 0.01 to 10% by volume.

Examples of the transparent conductive layer in the invention include a layer of an oxide such as $SnO_2$, $In_2O_3$, or ZnO, and a layer of a complex oxide, which is doped with a dopant, such as $SnO_2$ doped with Sb, $SnO_2$ doped with F, ZnO doped with Al, or $In_2O_3$ doped with Sn (ITO). The transparent conductive layer is preferably an amorphous layer containing as a main component at least one selected from the group consisting of these oxides. Further, examples of the transparent conductive layer in the invention include a layer of a nonoxide such as chalcogenide, LaBe, TiN, or TiC, a layer of metal such as Pt, Au, Ag or Cu, and a transparent conductive layer of CdO.

The thickness of the transparent conductive layer of the oxide or complex oxide is preferably from 0.1 to 1000 nm.

The substrate used in the invention will be explained below. The substrate in the invention is not specifically limited, and a plane shaped one in the form of plate, sheet or film or a solid one in the form of lens or another molding can be used as long as a layer can be formed on it. Further, shape or material of the substrate is not limited, as long as the substrate is exposed to a mixed gas in the plasma state whether it is still or moves to form a uniform layer in the invention on it. The substrate in the invention may be flat or solid. Examples of the flat one include a glass plate or a resin plate. Examples of the material for the substrate include glass, resin, ceramic, metal, and non-metal. Examples of the glass substrate include a glass plate and lens, and examples of the resin substrate include a resin lens, a resin film, a resin sheet, and a resin plate.

Since the resin film can be transported to a space between the electrodes or the vicinity of the electrodes in the atmospheric pressure plasma treatment apparatus in the invention to continuously form a transparent conductive layer, it is suitable for a large-scale production or continuous production process which results in high productivity, the process being not a batch process, for example, carrying out sputtering out under vacuum.

Materials of resin film, resin sheet, resin lens, or resin molding include cellulose ester such as cellulose triacetate, cellulose diacetate, cellulose acetate propionate, or cellulose acetate butyrate; polyester such as polyethylene terephthalate or polyethylene naphthalate; polyolefin such as polyethylene or polypropylene; polyvinylidene chloride; polyvinyl chloride; polyvinyl alcohol; ethylene-vinyl alcohol copolymer; syndiotactic polystyrene; polycarbonate; norbornene resin; polymethylpentene; polyetherketone; polyimide; polyether sulfone; polysulfone; polyether imide; polyamide; fluorine-containing resin; polymethyl acrylate; and acrylate copolymers.

These may be used singly or as an admixture of two or more thereof. Zeonex or Zeonor (produced by Nippon Zeon Co., Ltd., an amorphous cyclopolyolefin film ARTON (produced by Nippon Synthetic Rubber Co., Ltd.), a polycarbonate film Pureace (produced by Teijin Co., Ltd.), and a cellulose triacetate film KONICATAC KC4UX, KC8UX (produced by Konica Corporation), which are available on the market, are preferably used. Further, even materials with high birefringence such as polycarbonate, polyarylate, polysulfone and polyethersulfone can be used if in their film formation, solution casting or melt extrusion conditions or stretching conditions in the transverse or mechanical direction are properly selected.

Among these, a cellulose ester film, which is optically isotropic, is preferably used in the optical element in the invention. As the cellulose ester film, a cellulose triacetate film or a cellulose acetate propionate is preferably used. As the cellulose triacetate film, KONICATAC KC4UX available on the market is preferred.

A substrate, in which gelatin, polyvinyl alcohol, acryl resin, polyester resin, or cellulose ester resin is coated on the resin film described above, can be used. In the resin film on which the layer in the invention is formed, an anti-glare layer, a clear hard coat layer, a barrier layer, or an anti-stain layer may be provided on the side of the layer in the invention. Further, an adhesion layer, an alkali barrier coat layer, a gas barrier layer or a solvent resistant layer may be optionally provided on the resin film.

The substrate in the invention is not limited to the above. The thickness of the substrate in the invention, which is, for example, film-shaped, is preferably from 10 to 1000 μm, and more preferably from 40 to 200 μm.

EXAMPLES

The invention will be detailed according to the following examples, but is not limited thereto.

[Preparation of Electrode]

Two plate electrodes (hollow) with a size of 50 mm (length)×600 mm (width)×50 mm (height), made of a titanium alloy T64, were prepared as follows:

The both surfaces (having an area of 300 cm$^2$) of the two plate electrodes on the side facing each other were coated with an alumina thermal spray layer with high density and high adhesion according to an atmospheric plasma method. After that, a solution prepared by diluting tetramethoxysilane with ethyl acetate was coated on the resulting electrode, dried and hardened by UV ray irradiation to carry out sealing treatment. The dielectric layer surface of the resulting electrode was polished, smoothed, and processed to give an Rmax of 5 μm. The thus obtained dielectric layer had a void volume of 5% by volume. The dielectric layer had an SiOx content of 75 mol %. The thickness of the dielectric layer was 1 mm (the layer thickness variation falling within the range of ±1%). The relative dielectric constant of the dielectric was 10. The difference in linear thermal expansion coefficient between the conductive metal base material and the dielectric was $1.6 \times 10^{-6}$/° C. The heat resistant temperature was 250° C.

[Atmospheric Pressure Plasma Discharge Treatment Apparatus]

In the atmospheric pressure plasma discharge treatment apparatus as shown in FIG. 1, the two electrodes obtained above were set so that they were opposed to each other in parallel with each other and the space distance between them was 1 mm, and the first power supply and the second power supply as shown in Table 1 were set. The power supply A5 was used in continuous mode 100 kHz (This applies to examples described later). In sample No. 16, a DC pulse power supply was used as the first power supply, and repeated frequency in ON/OFF was 10 kHz. Temperature of the two electrodes was adjusted to be 80° C. The two filters set in the apparatus were chosen appropriately.

[Preparation of Titanium Oxide Layer]

The electric fields as shown in Table 1 being applied to the following mixed gas composition to induce discharge, a layer was formed on a substrate KONICATAC KC8UX produced by Konica Corporation. Thus, Sample Nos. 1 through 16 were obtained. In this case, the discharge starting electric field intensity was 3.7 kV/mm.

400 nm-through 700 nm. An optical thickness was calculated from $\lambda/4$ of the spectra, and then refractive index was calculated based on the calculation. Low refractive index exhibits an undesirable layer with low density and many holes, in which there may occur phenomenon that particles generated at a discharge space is incorporated into the layer or air is incorporated in the holes at measurement.

In sample Nos. 1 through 16, state-of-discharge was observed and refractive index was measured. The results are shown in Table 1.

TABLE 1

| | First power supply | | | | Second power supply | | | | Evaluation | | |
|---|---|---|---|---|---|---|---|---|---|---|---|
| Sample No. | Kinds | Frequency $\omega_1$ (Hz) | Strength of electric field $V_1$ (kV/mm) | Output density (W/cm$^2$) | Kinds | Frequency $\omega_2$ (Hz) | Strength of electric field $V_2$ (kV/mm) | Output density (W/cm$^2$) | State-of-discharge | Refractive index | Remarks |
| 1 | A2 | 5 k | 12 | 1 | B1 | 800 k | 1.2 | 10 | A | 2.28 | Inv. |
| 2 | A2 | 5 k | 12 | 1 | B2 | 2 M | 1.0 | 10 | A | 2.33 | Inv. |
| 3 | A2 | 5 k | 12 | 1 | B3 | 13.56 M | 0.8 | 10 | A | 2.32 | Inv. |
| 4 | A2 | 5 k | 12 | 1 | B4 | 27 M | 0.5 | 10 | A | 2.31 | Inv. |
| 5 | A2 | 5 k | 12 | 1 | B5 | 150 M | 0.2 | 10 | A | 2.25 | Inv. |
| 6 | A5 | 100 k | 8 | 1 | B3 | 13.56 M | 0.8 | 10 | A | 2.42 | Inv. |
| 7 | A5 | 100 k | 8 | 1 | B3 | 13.56 M | 0.2 | 1 | A | 2.20 | Inv. |
| 8 | A5 | 100 k | 8 | 1 | B3 | 13.56 M | 0.23 | 1.2 | A | 2.22 | Inv. |
| 9 | A5 | 100 k | 8 | 1 | B4 | 27 M | 0.8 | 20 | A | 2.40 | Inv. |
| 10 | A5 | 100 k | 8 | 1 | B5 | 150 M | 0.5 | 50 | A | 2.35 | Inv. |
| 11 | A5 | 100 k | 8 | 1 | B3 | 13.56 M | 0.15 | 0.8 | B | 1.85 | Comp. |
| 12 | A4 | 50 k | 3.7 | 0.5 | A5 | 100 k | 3.7 | 0.5 | B | * | Comp. |
| 13 | A2 | 5 k | 12 | 1 | A5 | 100 K | 8 | 1 | B | * | Comp. |
| 14 | A3 | 15 k | 3 | 0.1 | B1 | 800 K | 2 | 0.1 | C | ** | Comp. |
| 15 | B3 | 13.56 M | 0.8 | 0.2 | B3 | 13.56 M | 0.8 | 0.2 | C | ** | Comp. |
| 16 | *** | | 12 | 1 | B3 | 13.56 M | 0.8 | 10 | B | 1.78 | Comp. |

Inv: Invention,
Comp.: Comparative
*: Powder occurred.
**: No layer was formed.
***: direct current pulsed

| <Composition of mixed gas> | |
|---|---|
| Discharge gas: nitrogen | 97.9% by volume |
| Layer formation gas: tripropoxytitanium | 0.1% by volume |
| Addition gas: hydrogen | 2.0% by volume |

(Evaluation)

<State-of-Discharge>

State-of-discharge between the opposed electrodes was evaluated according to the following criteria:
A: Stable discharge was carried out.
B: Discharge was carried out but unstably.
C: No discharge occurred.

<Refractive Index>

Reflection spectra of the resulting samples were measured under condition of a 5° regular reflection through a spectrophotometer TYPE 1U-4000 (produced by Hitachi Seisakusho Co., Ltd.). The back surface of the samples opposite the formed layer was surface-roughened, and subjected to light absorbing treatment employing with black spray to form a light absorbing layer and to prevent light reflection from the back surface. Reflection spectra of the resulting samples were measured at the wavelength region of from (Conclusion)

In sample Nos. 1 through 10, employing 1) the relationship between frequency $\omega_1$ of the first high frequency electric field and frequency $\omega_2$ of the second high frequency electric field, 2) the relationship among strength $V_1$ of the first high frequency electric field, strength $V_2$ of the second high frequency electric field, and discharge starting electric field intensity IV of the discharge gas, and 3) power density of the second high frequency electric field, each falling within the scope of the invention, stable discharge was carried out, and a layer with high density was obtained (judged from the magnitude of refractive index). In sample No. 11 through 16, employing a high frequency electric field falling outside the scope of the invention, stable discharge was carried out, but layer formation ability was insufficient, and as a result, a layer with many holes was formed and a layer with high density was not formed (refractive index was low), or no discharge was induced, and no layer was formed on the substrate.

Example 2

Sample Nos. 17 through 23 were prepared in the same manner as in Example 1, except that the first and second power supplies were replaced with tthose as shown in Table 2, and a fist filter and a second filter each shown in Table 2 were provided.

Sample Nos. 17 through 23 were evaluated in the same manner as in Example 1. The results are shown in Table 2.

TABLE 2

| | First electric field | | | | |
|---|---|---|---|---|---|
| Sample No. | Kinds of power supply | Frequency $\omega_1$ (Hz) | Strength of electric field $V_1$ (kV/mm) | Power density (W/cm²) | First filter Kinds |
| 17 | A2 | 5 k | 12 | 1 | Capacitor (100 pF) |
| 18 | A5 | 100 k | 8 | 1 | Capacitor (100 pF) |
| 19 | A2 | 5 k | 12 | 1 | Coil (1 μH) |
| 20 | A5 | 100 k | 8 | 1 | Coil (1 μH) |
| 21 | B1 | 800 k | 1.2 | 1 | Coil (10 μH) |
| 22 | B3 | 13.56 M | 0.8 | 1 | None |
| 23 | A4 | 50 k | 10 | 1 | None |

| | Second electric field | | | | |
|---|---|---|---|---|---|
| Sample No. | Kinds of power supply | Frequency $\omega_2$ (Hz) | Strength of electric field $V_1$ (kV/mm) | Power density (W/cm²) | Second filter Kinds |
| 17 | B3 | 13.56 M | 0.8 | 10 | Coil (1 μH) |
| 18 | B3 | 13.56 M | 0.8 | 10 | Coil (1 μH) |
| 19 | B1 | 800 k | 1.2 | 10 | Coil (1 μH) |
| 20 | B1 | 800 k | 1.2 | 10 | Coil (1 μH) |
| 21 | B1 | 800 k | 1.2 | 10 | Coil (1 μH) |
| 22 | | | None | | |
| 23 | | | None | | |

| | Evaluation | | |
|---|---|---|---|
| Sample No. | State-of-Discharge | Refractive index | Remarks |
| 17 | A | 2.33 | Inv. |
| 18 | A | 2.32 | Inv. |
| 19 | A | 2.22 | Inv. |
| 20 | A | 2.28 | Inv. |
| 21 | C | ** | Comp. |
| 22 | C | ** | Comp. |
| 23 | A | 1.63 | Comp. |

Inv.: Invention,
Comp.: Comparative
**: No layer was formed.

(Conclusion)

Regarding inventive samples Nos. 17 through 20, prepared employing the atmospheric pressure plasma discharge treatment apparatus equipped with the filters as shown in Table 2, discharge normally occurred, and a good layer was formed. Regarding comparative sample No. 21, no discharge occurred and a layer was not formed, in which the filters employed were not adapted to the frequency of the first and second power supplies in the apparatus. Comparative sample Nos. 22 and 23 were prepared employing an ordinary atmospheric pressure plasma discharge treatment apparatus in which an application electrode and a ground electrode opposed to each other were set as opposed electrodes (no filter was set). Regarding Sample No. 22, electric field was applied to the application electrode from a power supply of a frequency higher than an ordinary one, but no discharge occurred and no layer was formed. Regarding Sample No. 23, electric field was applied to the application electrode from a power supply of lower frequency, but although discharge occurred, a good layer was not formed.

Example 3

A back coat layer was coated on one surface of a long length film KONICATAC KC4UX (1500 m roll film), and a hard coat layer on the other surface of the film as described later to obtain a substrate with a hard coat layer, and the resulting substrate was wound around a take-up spool. An anti-reflection film was prepared from the substrate employing three of the apparatus as shown in FIG. 2 in which first, second and third atmospheric pressure plasma discharge treatment apparatuses were connected in that order in series. The substrate was unwound, and a medium refractive index layer was formed on the hard coat layer of the substrate in the first atmospheric pressure plasma discharge treatment apparatus, a high refractive index layer on the resulting medium refractive index layer in the second atmospheric pressure plasma discharge treatment apparatus, and finally, a low refractive index layer on the resulting high refractive index layer in the third atmospheric pressure plasma discharge treatment apparatus. Thus, anti-reflection films (sample Nos. 24 through 27) having a structure of back coat layer/substrate F/hard coat layer/medium refractive index layer/high refractive index layer/low refractive index layer were obtained.

[Preparation of Substrate]

<Preparation of Substrate with a Clear Hard Coat Layer>

The following back coating layer coating composition was coated on the one surface of KONICATAC KC4UX to form a back coat layer, and the following clear hard coating composition was coated on the other surface to form a clear hard coat layer with a center line average surface roughness Ra of 15 nm and with a dry thickness of 4 μm. Thus, a substrate with a clear hard coat layer was obtained.

| <<Back coating layer coating composition>> | |
|---|---|
| Acetone | 30 parts by weight |
| Ethyl acetate | 45 parts by weight |
| Isopropyl alcohol | 10 parts by weight |
| Diacetyl cellulose | 0.5 parts by weight |
| 2% acetone dispersion liquid of Aerosil 200 V (produced by Nihon Aerosil Co., Ltd. | 0.1 parts by weight |

| <<Clear hard coat layer coating composition>> | |
|---|---|
| Dipentaerythritol hexacrylate monomer | 60 parts by weight |
| Dipentaerythritol hexacrylate dimmer | 20 parts by weight |
| Dipentaerythritol hexacrylate trimer and polymer higher than the trimer | 20 parts by weight |
| Dimethoxybenzophenone (photoinitiator) | 4 parts by weight |
| Ethyl acetate | 50 parts by weight |
| Methyl ethyl ketone | 50 parts by weight |
| Isopropyl alcohol | 50 parts by weight |

[Preparation of Electrode]

In the atmospheric pressure plasma discharge treatment apparatus as shown in FIG. 2, the dielectric coated roll electrode and plural dielectric coated prismatic electrodes were prepared as follows:

A jacket roll metal base material made of titanium alloy T64 having a cooling device employing chilled water was coated with an alumina spray coat layer with high density and high adhesion according to an atmospheric plasma method to give a roll diameter of 1000 mm.

After that, sealing treatment and surface polishing were carried out to give an Rmax of 5 μm in the same manner as in Example 1. Thus, a roll electrode as a first electrode was obtained. The dielectric layer of the resulting roll electrode had a void volume of substantially zero % by volume. The dielectric layer had an SiOx content of 75 mol %. The thickness of the dielectric layer was 1 mm. The relative dielectric constant of the dielectric was 10. The difference in linear thermal expansion coefficient between the conductive metal base material and the dielectric was $1.7 \times 10^{-6}/°$ C. The heat resistant temperature was 260° C.

A hollow prismatic titanium alloy T64 having a cooling device was coated with the same dielectric layer as above in the same manner as above. Thus, a prismatic electrode as a second electrode was obtained. The surface roughness Rmax, the SiOx content of the dielectric layer, the thickness of the dielectric layer, the relative dielectric constant of the dielectric, and the difference in linear thermal expansion coefficient between the conductive metal base material and the dielectric, and the heat resistant temperature in the resulting prismatic electrode were substantially the same as those of the roll electrode above.

Twenty five prismatic electrodes were set opposed to the roll electrode so that the space distance between the roll electrode and the prismatic electrodes was 1 mm. The total discharge surface area of the prismatic electrodes was 15000 cm$^2$ {=150 cm (length in the width direction)×4 cm (length in the transport direction)×25 (the number of the electrodes) }. The filters set in the apparatus was chosen appropriately. Necessary electrical power was made up by extending power supplies in the same kind.

[Preparation of Anti-Reflection Film]

During plasma discharge, temperature of the first electrode (roll electrode) and the second electrode (fixed prismatic electrodes) were maintained at 80° C., and the roll electrode was rotated through a driver. A layer was formed on the substrate as follows. The first and second power supplies used in each of the three apparatuses were those as shown in Table 3, and each power supply was grounded. The pressure during discharge was 103 kPa. The following mixed gas was introduced into the discharge space in each apparatus, and the clear hard coat layer of the substrate obtained above was subjected to continuous plasma discharge treatment to form, on the hard coat layer, a medium refractive index layer, a high refractive index layer and a low refractive index layer in that order and to obtain an anti-reflection film with three layers laminated. Thus, sample Nos. 24 and 27 were obtained.

<<Composition of mixed gas for medium refractive index layer>>

| | |
|---|---|
| Discharge gas: nitrogen | 99.4% by volume |
| Layer formation gas: dibutyldiacetoxytin | 0.1% by volume |
| (gasified by a vaporizer produced by Rintex Co., Ltd, and mixed with argon) | |
| Addition gas: oxygen | 0.5% by volume |

-continued

<<Power supply condition for medium refractive index layer>>

| | |
|---|---|
| Power density supplied to the first electrode: | 1 W/cm$^2$ |
| Power density supplied to the second electrode: | 5 W/cm$^2$ |

<<Composition of mixed gas for high refractive index layer>>

| | |
|---|---|
| Discharge gas: nitrogen | 99.4% by volume |
| Layer formation gas: tetraisopropoxy-Titanium (gasified by a vaporizer produced by Rintex Co., Ltd, and mixed with argon) | 0.1% by volume |
| Addition gas: oxygen | 0.5% by volume |

<<Power supply condition for high refractive index layer>>

| | |
|---|---|
| Power density supplied to the first electrode: | 1 W/cm$^2$ |
| Power density supplied to the second electrode: | 5 W/cm$^2$ |

<<Composition of mixed gas for low refractive index layer>>

| | |
|---|---|
| Discharge gas: nitrogen | 98.9% by volume |
| Layer formation gas: tetraethoxysilane (gasified by a vaporizer produced by Rintex Co., Ltd, and mixed with argon) | 0.1% by volume |
| Addition gas: oxygen | 1% by volume |

<<Power supply condition for low refractive index layer>>

| | |
|---|---|
| Power density supplied to the first electrode: | 1 W/cm$^2$ |
| Power density supplied to the second electrode: | 3 W/cm$^2$ |

In sample Nos. 24 through 27 obtained above, state-of-discharge was evaluated in the same manner as in Example 1, and the following evaluation was carried out. The results are shown in Table 3.

[Evaluation]

<Average Spectral Reflectance>

The spectral reflectance of samples sampled 10 minutes after discharge started was measured under condition of a 5° regular reflection through a spectrophotometer TYPE 1U-4000 (produced by Hitachi Seisakusho Co., Ltd.). A back surface of the anti-reflection film opposite the anti-reflection layer was surface-roughened, and subjected to light absorbing treatment employing with black spray to form a light absorbing layer and to prevent light reflection from the back surface. Reflection spectra of the resulting film were measured employing a wavelength of from 400 nm through 700 nm. The average spectral reflectance was determined at a wavelength of from 500 to 650 nm of the resulting spectra. The average spectral reflectance was evaluated according to the following criteria:

A: not more than 0.2

B: more than 0.2 to less than 0.5

C: not less than 0.5

D: Reflectance could not be measured, since layer formation was insufficient.

TABLE 3

| Sample No. | *First electric field | | | **Second electric field | | | Evaluation | | Remarks |
|---|---|---|---|---|---|---|---|---|---|
| | Kinds of power supply | Frequency $\omega_2$ (Hz) | Strength of electric field $V_1$ (kV/mm) | Kinds of power supply | Frequency $\omega_2$ (Hz) | Strength of electric field $V_2$ (kV/mm) | State-of-discharge | Average spectral reflectance | |
| 24 | A3 | 15 k | 11 | B1 | 800 k | 1.2 | A | A | Inv. |
| 25 | A5 | 100 k | 8 | B3 | 13.56 M | 0.8 | A | A | Inv. |
| 26 | A2 | 5 k | 12 | A2 | 5 k | 12 | A | D | Comp. |
| 27 | B2 | 2 M | 1.0 | B2 | 2 M | 1.0 | C | *** | Comp. |

Inv.: Invention,
Comp.: Comparative
*: The three first power supplies used were the same.
**: The three second power supplies used were the same.
***: No layer was formed.

(Conclusion)

The anti-reflection films (sample Nos. 24 and 25) with three layers layered according to the method of the invention, provided the intended average spectral reflectance. The state-of-discharge in all the apparatuses was normal. In contrast, sample No. 26 employing the electric field falling outside the scope of the invention, although the state-of-discharge was good, provided poor average spectral reflectance as compared with the inventive ones. Further, sample No. 27, no discharge occurred and no layer was formed.

Example 4

[Preparation of Anti-Reflection Film]

One of the atmospheric pressure plasma discharge treatment apparatus as shown in FIG. 2 was employed. The electrodes and dielectrics were the same as used in Example 3. Temperature of the first electrode was maintained at 150° C., and temperature of the second electrode was maintained at 80° C. A layer was formed on a substrate as follows: The power supplies as shown in Table 4 were used. As the substrate, a 100 μm thick ARTON film (amorphous cyclo-polyolefin film, produced by JSR Co., Ltd.) was used. The pressure during discharge was 103 kPa. The following mixed gas was introduced into the discharge space in the apparatus, and a transparent conductive layer was formed on the substrate. Thus, transparent conductive film sample Nos. 28 through 32 were obtained. The filters set in the apparatus was chosen appropriately.

| <Composition of mixed gas> | |
|---|---|
| Discharge gas: nitrogen | 98.65% by volume |
| Layer formation gas 1: tris-(2,4-pentanedionato)indium | 1.2% by volume |
| Layer formation gas 2: dibutyl-diacetoxytin | 0.05% by volume |
| Addition gas: hydrogen | 0.1% by volume |

Sample Nos. 28 through 32 obtained above were evaluated according to the following, and the results are shown in Table 4

[Evaluation]<Resistivity (Ω·cm)>

Resistivity was measured according to JIS-R-1637, employing a four terminal method. The measurement was carried out employing Loresta GP, MCP-T600 produced by Mitsubishi Chemical Corporation.

<Transmittance (%)>

Transmittance was measured according to JIS-R-1635, employing a spectrophotometer TYPE 1U-4000 (produced by Hitachi Seisakusho Co., Ltd.). The wavelength of light used was 550 nm.

TABLE 4

| | First electric field | | | |
|---|---|---|---|---|
| Sample No. | Kinds of power supply | Frequency $\omega_1$ (Hz) | Strength of electric field $V_1$ (kV/mm) | Power density (W/cm²) |
| 28 | A2 | 5 k | 12 | 1 |
| 29 | A4 | 50 k | 10 | 1 |
| 30 | A6 | 200 k | 5 | 1 |
| 31 | A6 | 200 k | 5 | 1 |
| 32 | B3 | 13.56 M | 0.8 | 0.2 |

| | Second electric field | | | |
|---|---|---|---|---|
| Sample No. | Kinds of power supply | Frequency $\omega_2$ (Hz) | Strength of electric field $V_2$ (kV/mm) | Power density (W/cm²) |
| 28 | B3 | 13.56 M | 0.8 | 10 |
| 29 | B3 | 13.56 M | 0.8 | 10 |
| 30 | B3 | 13.56 M | 0.8 | 10 |
| 31 | B1 | 800 k | 1.2 | 10 |
| 32 | B3 | 13.56 M | 0.8 | 0.2 |

| | Evaluation | | |
|---|---|---|---|
| Sample No. | Transmittance (%) | Resistivity × $10^{-4}$ (Ω·cm) | Remarks |
| 28 | 91 | 2.1 | Inv. |
| 29 | 92 | 2.2 | Inv. |
| 30 | 92 | 1.8 | Inv. |
| 31 | 88 | 3.5 | Inv. |
| 32 | No layear formed | | Comp. |

Inv: Invention,
Comp.: Comparative (Conclusion)

Inventive sample Nos. 28 through 31 were excellent in layer formation property and layer density, and provided a substrate having a transparent conductive layer with high transmittance, very low resistivity, and high performance. On the contrary, Comparative sample No. 32 did not form a layer, since no discharge was induced.

substrate passes the discharge space where discharge is carried out is defined as layer formation rate. For example, when a substrate passes a discharge space of a length of 1 m at a transport speed of 1 m/min, the layer formation time is 1 minute. When a 60 nm layer is formed in one minute, then the layer formation rate is 1 nm/sec.

The results are shown in Table 5.

TABLE 5

| | First electric field | | | | | Second electric field | | | | | Evaluation | | |
|---|---|---|---|---|---|---|---|---|---|---|---|---|---|
| | | | Strength | | | | | Strength | | | | | |
| Sample No. | Kinds of power supply | Frequency $\omega_1$ (Hz) | of electric field $V_1$ (kV/mm) | Power density (W/cm$^2$) | First filter | Kinds of power supply | Frequency $\omega_2$ (Hz) | of electric field $V_2$ (kV/mm) | Power density (W/cm$^2$) | Second filter | Layer thickness distribution | Layer formation rate (nm/sec) | Remarks |
| 33 | A5 | 100 k | 15 | 50 | *1 | B3 | 13.56 M | 0.8 | 10 | *2 | A | 18 | Inv. |
| 34 | A5 | 100 k | 13 | 20 | *1 | B3 | 13.56 M | 0.8 | 10 | *2 | A | 18 | Inv. |
| 35 | A5 | 100 k | 12 | 10 | *1 | B3 | 13.56 M | 0.8 | 10 | *2 | A | 15 | Inv. |
| 36 | A5 | 100 k | 10 | 5 | *1 | B3 | 13.56 M | 0.8 | 10 | *2 | A | 15 | Inv. |
| 37 | A5 | 100 k | 8 | 1 | *1 | B3 | 13.56 M | 0.8 | 10 | *2 | A | 5 | Inv. |
| 38 | A5 | 100 k | 6 | 0.8 | *1 | B3 | 13.56 M | 0.8 | 10 | *2 | B | 4 | Inv. |
| 39 | A5 | 100 k | 12 | 10 | *1 | B3 | 13.56 M | 1.2 | 20 | *2 | A | 25 | Inv. |
| 40 | A5 | 100 k | 12 | 10 | *1 | B3 | 13.56 M | 2.5 | 50 | *2 | A | 30 | Inv. |

Inv.: Invention
*1: Capacitor (500 pF)
*2: Coil (20 µH)

Example 5

Sample Nos. 33 through 40 were prepared in the same manner as in Example 4, except that power densities being supplied to the electrodes as shown in Table 5 were used.

[Evaluation]
<Layer Thickness Distribution>

Reflection spectra of samples were measured under condition of a 5° regular reflection through a spectrophotometer TYPE 1U-4000 (produced by Hitachi Seisakusho Co., Ltd.). The back surface of the samples opposite the formed layer was surface-roughened, and subjected to light absorbing treatment employing with black spray to form a light absorbing layer and to prevent light reflection from the back surface. Reflection spectra of the resulting samples were measured employing a wavelength of from 400 nm through 700 nm. An optical thickness was calculated from λ/4 of the spectra. Layer thickness was measured at ten points at a pitch of 1 cm, and thickness distribution was obtained according to the following formula: Layer thickness distribution (%)=(Maximum layer thickness-Minimum layer thickness)×100/Average layer thickness The sample was evaluated according to the following criteria:
A: Layer thickness distribution was less than 1%.
B: Layer thickness distribution was from 1% to less than 3%.
C: Layer thickness distribution was from 3% to less than 10%.
D: Layer thickness distribution was not less than 10%.

<Layer Formation Rate>
A value obtained by dividing the average layer thickness calculated above with time (layer formation time) when the (Conclusion)

It has been confirmed that uniformity of a layer formed and layer formation speed are further improved by increasing output of the first power supply.

EFFECT OF THE INVENTION

The present invention can provide a layer formation method which can generate high density plasma even employing a cheap and safe discharge gas such as a nitrogen gas, and form a layer with high quality at high speed, and can provide a substrate having a layer with high quality and high performance at low cost employing the method.

What is claimed is:
1. A layer formation method comprising the steps of supplying a discharge gas to a discharge space,
exciting the supplied discharge gas at atmospheric pressure or at approximately atmospheric pressure by applying a high frequency electric field across the discharge space,
transmitting the energy of the excited discharge gas to a layer formation gas such that the layer formation gas is in an excited state and
exposing a substrate to the layer formation gas in the excited state, whereby a layer is formed on the substrate,
wherein the high frequency electric field is an electric field in which a first high frequency electric field and a second high frequency electric field are superposed, frequency $\omega_2$ of the second high frequency electric field is higher than frequency $\omega_1$ of the first high frequency electric field,
strength $V_1$ of the first high frequency electric field, strength $V_2$ of the second high frequency electric field and strength IV of discharge starting electric field satisfy relationship $V_1 \geq IV > V_2$ or $V_1 > IV \geq V_2$, and power density of the second high frequency electric field is not less than 1 W/cm².

2. The layer formation method of claim 1, wherein the discharge space is provided between a first electrode and a second electrode opposed to each other.

3. The layer formation method of claim 2, wherein the first high frequency electric field is applied to the first electrode, and the second high frequency electric field is applied to the second electrode.

4. The layer formation method of claim 2, wherein the organometallic compound gas is at least one compound selected from the group consisting of an organosilicon compound, an organotitanium compound, an organotin compound, an organozin compound, an organoindium compound, and an organoaluminum compound.

5. The layer formation method of claim 1, wherein the power density of the second high frequency electric field is not more than 50 W/cm2.

6. The layer formation method of claim 1, wherein the power density of the second high frequency electric field is not more than 20 W/cm2.

7. The layer formation method of claim 1, wherein the power density of the first high frequency electric field is not less than 1 W/cm2.

8. The layer formation method of claim 7, wherein the power density of the first high frequency electric field is not more than 50 W/cm2.

9. The layer formation method of claim 1, wherein the waveform of the first high frequency electric field and the second high frequency electric field is a sine waveform.

10. The layer formation method of claim 1, wherein the discharge gas contains a nitrogen gas in an amount of 50 to 100% by volume.

11. The layer formation method of claim 10, wherein the discharge gas contains rare gas in an amount of less than 50% by volume.

12. The layer formation method of claim 1, wherein the layer formation gas contains at least one gas selected from the group consisting of an organometallic compound gas, a metal halide gas and a metal hydride gas.

* * * * *